(12) United States Patent
Yin et al.

(10) Patent No.: US 7,449,964 B2
(45) Date of Patent: Nov. 11, 2008

(54) SYSTEM AND METHOD FOR TUNING OUTPUT DRIVERS USING VOLTAGE CONTROLLED OSCILLATOR CAPACITOR SETTINGS

(75) Inventors: Guangming Yin, Foothill Ranch, CA (US); Bo Zhang, Las Flores, CA (US); Ichiro Fujimori, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 637 days.

(21) Appl. No.: 11/120,738

(22) Filed: May 3, 2005

(65) Prior Publication Data

US 2005/0190004 A1 Sep. 1, 2005

Related U.S. Application Data

(63) Continuation of application No. 10/639,079, filed on Aug. 12, 2003, now Pat. No. 6,909,332.

(60) Provisional application No. 60/403,457, filed on Aug. 12, 2002.

(51) Int. Cl.
 *H03L 7/00* (2006.01)

(52) U.S. Cl. ............... 331/36 C; 331/34; 331/16; 331/177 V; 331/179; 331/177 R; 341/63; 710/1

(58) Field of Classification Search ............. 331/34, 331/16, 177 V, 179, 177 R; 710/1; 341/63
See application file for complete search history.

(56) References Cited

U.S. PATENT DOCUMENTS 6,909,332 B2 * 6/2005 Yin et al. ............... 331/36 C

* cited by examiner

*Primary Examiner*—Arnold Kinkead
(74) *Attorney, Agent, or Firm*—Garlick Harrison & Markison; Bruce E. Garlick

(57) ABSTRACT

The present invention provides a method for tuning output drivers to an operating frequency based on settings used to tune other devices within the device such as a VCO. First the VCO within a PLL and clock circuit is tuned to the desired operating frequency. This operating frequency then corresponds to a discrete tuning setting. The discrete setting that causes the VCO to function at the operating frequency are then transferred to scaled amplifiers within output drivers. These drivers are then tuned to the operating frequency with these settings. This process eliminates the need to individually tune each output driver to function properly at the operating frequency.

24 Claims, 24 Drawing Sheets

Receiver Input and Source Centered Clock Performance

| Parameter | Symbol | Conditions | Min | Typ | Max | Units |
|---|---|---|---|---|---|---|
| Output Common Mode | Vcm | See Figure Below | 1575 | 1675 | 1775 | mV |
| Single Ended Output Impedance | $Z_{SE}$ | | 40 | 50 | 60 | Ω |
| Differential Input impedance | $Z_d$ | | 80 | 100 | 120 | Ω |
| Input Impedance Mismatch | $Z_M$ | | | | 10 | % |
| Q40, CML Input Differential Amplitude, p-p | ∆ VQDO | See Figure Below | 400 | 500 | 600 | mV |
| Q40 Input Rise and Fall Time (20% to 80%) | $t_{RH}$, $t_{FH}$ | | | 25 | 35 | ps |
| Differential output return loss* | S11 | Up to 7.5 GHz | | | | dB |
| 4-by-1 mux input return loss >15 db at 10 GHz | | | | | | |

← 400

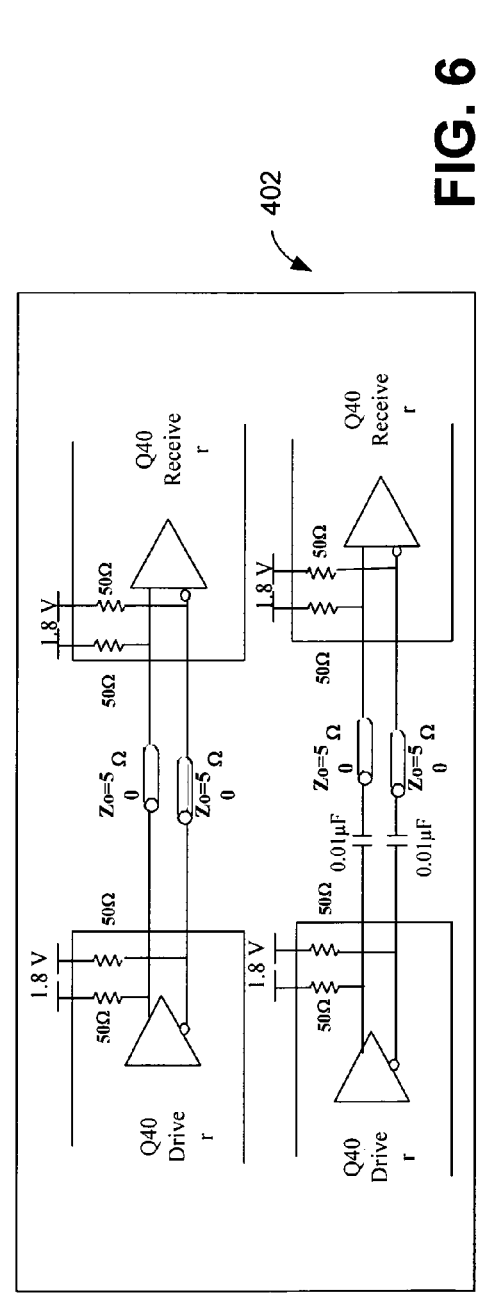

SYSTEM AND METHOD FOR TUNING OUTPUT DRIVERS USING VOLTAGE CONTROLLED OSCILLATOR CAPACITOR SETTINGS

CROSS REFERENCE TO RELATED APPLICATIONS

This application is a continuation of U.S. application Ser. No. 10/639,079, now U.S. Pat. No. 6,909,332, entitled "SYSTEM AND METHOD FOR TUNING OUTPUT DRIVERS USING VOLTAGE CONTROLLED OSCILLTOR CAPACITOR SETTINGS," by Guangming Yin filed Aug. 12, 2003, which claims priority to U.S. Provisional Application Ser. No. 60/403,457, filed Aug. 12, 2002, and to U.S. application Ser. No. 10/445,771 filed May 27, 2003, all of which are incorporated herein by reference in their entirety for all purposes.

TECHNICAL FIELD OF THE INVENTION

The present invention relates generally to communication systems; and more particularly to a system and method of tuning output drivers within a high-speed serial bit stream communications.

DESCRIPTION OF RELATED ART

The structure and operation of communication systems is generally well known. Communication systems support the transfer of information from one location to another location. Early examples of communication systems included the telegraph and the public switch telephone network (PSTN). When initially constructed, the PSTN was a circuit switched network that supported only analog voice communications. As the PSTN advanced in its structure and operation, it supported digital communications. The Internet is a more recently developed communication system that supports digital communications. As contrasted to the PSTN, the Internet is a packet switch network.

The Internet consists of a plurality of switch hubs and digital communication lines that interconnect the switch hubs. Many of the digital communication lines of the Internet are serviced via fiber optic cables (media). Fiber optic media supports high-speed communications and provides substantial bandwidth, as compared to copper media. At the switch hubs, switching equipment is used to switch data communications between digital communication lines. WANs, Internet service providers (ISPs), and various other networks access the Internet at these switch hubs. This structure is not unique to the Internet, however. Portions of the PSTN, wireless cellular network infrastructure, Wide Area Networks (WANs), and other communication systems also employ this same structure.

The switch hubs employ switches to route incoming traffic and outgoing traffic. A typical switch located at a switch hub includes a housing having a plurality of slots that are designed to receive Printed Circuit Boards (PCBs) upon which integrated circuits and various media connectors are mounted. The PCBs removably mount within the racks of the housing and typically communicate with one another via a back plane of the housing. Each PCB typically includes at least two media connectors that couple the PCB to a pair of optical cables and/or copper media. The optical and/or copper media serves to couple the PCB to other PCBs located in the same geographic area or to other PCBs located at another geographic area.

For example, a switch that services a building in a large city couples via fiber media to switches mounted in other buildings within the city and switches located in other cities and even in other countries. Typically, Application Specific Integrated Circuits (ASICs) are mounted upon the PCBs of the housing. These ASICs perform switching operations for the data that is received on the coupled media and transmitted on the coupled media. The coupled media typically terminates in a receptacle and transceiving circuitry coupled thereto performs signal conversion operations. In most installations, the media, e.g., optical media, operates in a simplex fashion. In such case, one optical media carries incoming data (RX data) to the PCB while another optical media carries outgoing data (TX data) from the PCB. Thus, the transceiving circuitry typically includes incoming circuitry and outgoing circuitry, each of which couples to a media connector on a first side and communicatively couples to the ASIC on a second side. The ASIC may also couple to a back plane interface that allows the ASIC to communicate with other ASICs located in the enclosure via a back plane connection. The ASIC is designed and implemented to provide desired switching operations. The operation of such enclosures and the PCBs mounted therein is generally known.

The conversion of information from the optical media or copper media to a signal that may be received by the ASIC and vice versa requires satisfaction of a number of requirements. First, the coupled physical media has particular RX signal requirements and TX signal requirements. These requirements must be met at the boundary of the connector to the physical media. Further, the ASIC has its own unique RX and TX signal requirements. These requirements must be met at the ASIC interface. Thus, the transceiving circuit that resides between the physical media and the ASIC must satisfy all of these requirements.

Various standardized interfaces have been employed to couple the transceiving circuit to the ASIC. These standardized interfaces include the XAUI interface, the Xenpak interface, the GBIC interface, the XGMII interface, and the SFI-5 interface, among others. The SFI-5 interface, for example, includes 16 data lines, each of which supports a serial bit stream having a nominal bit rate of 2.5 Giga bits-per-second (GBPS). Line interfaces also have their own operational characteristics. Particular high-speed line interfaces are the OC-768 interface and the SEL-768 interface. Each of these interfaces provides a high-speed serial interface operating at a nominal bit rate of 40 GBPS.

Particular difficulties arise in converting data between the 40×1 GBPS line interface and the 16×2.5 GBPS communication ASIC interface. In particular, operation on the 40 GBPS side is particularly susceptible to noise and requires the ability to switch data at a very high bit rate, e.g., exceeding the bit rate possible with a CMOS integrated circuit formed of Silicon. While other materials, e.g., Indium-Phosphate and Silicon-Germanium provide higher switching rates than do Silicon based devices, they are very expensive and difficult to manufacture. Further, the functional requirements of interfacing the 40×1 GBPS line interface and the 16×2.5 GBPS communication ASIC interface are substantial. Thus, if a device were manufactured that could perform such interfacing operations; the effective yield in an Indium-Phosphate or Silicon-Germanium process would be very low.

Voltage Controlled Oscillators (VCOs) are often used to generate the clock signals within these circuits. The VCO must produce a stable clock. The operating frequency of this clock signal is then matched within each output drivers. Individually tuning each output driver in a complex high-speed serial bit stream communications having a plethora of output drivers is both repetitive and inefficient.

Further, the quality factor of drivers operating on data and clock signals in high-speed data communications systems running at clock and data rates in excess of 10 GHPS must be optimized, otherwise the integrity of data can be adversely impacted. Additionally, output drivers must be tuned to match the frequency of the clock and data signals. Such drivers often serve within delay elements or buffers within high speed circuits and are critical to data integrity. These drivers are typically tuned using a network of capacitors. If the quality factor of the network is too high, the response will only operate properly within a narrow capacitance range. If the quality factor is too low, the overall gain will drop below an acceptable level. Typically, output drivers are individually tuned to their operating frequencies. Thus, the need exists for a more efficient way of tuning these output drivers.

BRIEF SUMMARY OF THE INVENTION

The present invention provides a high-speed data conversion circuit. More specifically, a high speed bit stream data conversion circuit that includes a first data conversion circuit that receives a first bit stream(s) at a first bit rate and a corresponding first bit stream data clock. The first data conversion circuit then produces a second bit stream(s) having a second bit rate, wherein the number and bit rate of the first bit stream(s) and the second bit stream(s) differ.

A clock circuit produces a Reference Clock Signal to latch data from the first bit stream(s). This clock circuit includes a phase locked loop (PLL) with a phase detector that receives the first bit stream data clock and a loop output. The clock circuit may also further include a phase detector operable to generate a phase adjustment signal to the first data conversion circuit. The clock circuit further includes a charge pump, a loop filter, a Voltage Controlled Oscillator (VCO), and a divider.

One VCO configuration includes a pair of cross-coupled transistors, an inductor coupled to the cross-coupled transistors. An optional filtering circuit, having a capacitor and a resistor pair, may be employed to reduce noise contained within inputs to the VCO. The resistor pair further acts as a voltage divider to reduce the voltage applied to the VCO. A network of switchable tuning capacitors, a varactor, or other like tunable capacitor network, tune the VCO to function at a specific operating frequency. The VCO is tuned to function at a specific operating frequency by adjusting switch settings to a network of switchable tuning capacitors. These capacitors may comprise both coarse and fine tuning capacitors. Alternatively, the network may be supplemented or replaced by a varactor. Tuning settings necessary to achieve the desired operating frequency may then be transferred to corresponding switchable tuning capacitors or varactors within output drivers. This ensures the output drivers are tuned to the proper frequency without the need to individually tune each output driver.

The first data conversion circuit may either multiplex or demultiplex the first bit stream(s) into the second bit stream(s). Additionally, a second data conversion circuit may receive the second bit stream(s) and multiplex or demultiplex the second bit stream(s) into a third bit stream(s). When multiplexing the number of the third bit stream(s) is less than the number of the second bit stream(s), and the bit rate of the third bit stream(s) exceeds the bit rate of the second bit stream(s). When demultiplexing the number of the third bit stream(s) exceed the number of the second bit stream(s), and the bit rate of the second bit stream(s) exceeds the bit rate of the third bit stream(s).

Another embodiment provides a clock circuit that produces a Reference Clock Signal. This clock circuit includes a phase locked loop (PLL) having a phase detector that receives a first bit stream data clock and a loop output. The PLL further includes a charge pump, a loop filter, a Voltage Controlled Oscillator (VCO), and a divider.

As previously discussed, the VCO may comprises a pair of cross-coupled transistors, an inductor coupled to the cross-coupled transistors, or other like VCO configurations known to those skilled in the art. The VCO is tuned to function at a specific operating frequency by adjusting switch setting to a network of switchable tuning capacitors. These capacitors may comprise both coarse and fine tuning capacitors. Alternatively, the network may be supplemented or replaced by a varactor. Tuning settings necessary to achieve the desired operating frequency may then be transferred to corresponding switchable tuning capacitors or varactors within the output drivers. This ensures the output drivers are tuned to the proper operating frequency without the need to individually tune each output driver.

Yet another embodiment provides a method for tuning output drivers to an operating frequency based on settings used to tune other devices within the device such as a VCO. First the VCO within a PLL and clock circuit is tuned to the desired operating frequency. This operating frequency then corresponds to a discrete tuning setting. The discrete setting that causes the VCO to function at the operating frequency are then transferred to scaled amplifiers within output drivers. These drivers are then tuned to the operating frequency with these settings. This process eliminates the need to individually tune each output driver to function properly at the operating frequency.

BRIEF DESCRIPTION OF THE SEVERAL VIEWS OF THE DRAWINGS

These and other features, aspects and advantages of the present invention will be more fully understood when considered with respect to the following detailed description, appended claims and accompanying drawings wherein:

FIG. 6 is a table and a diagram that illustrate operating specifications for the RX interface between the RX data demultiplexer circuits of FIG. 3;

DETAILED DESCRIPTION OF THE INVENTION

Figure 1:
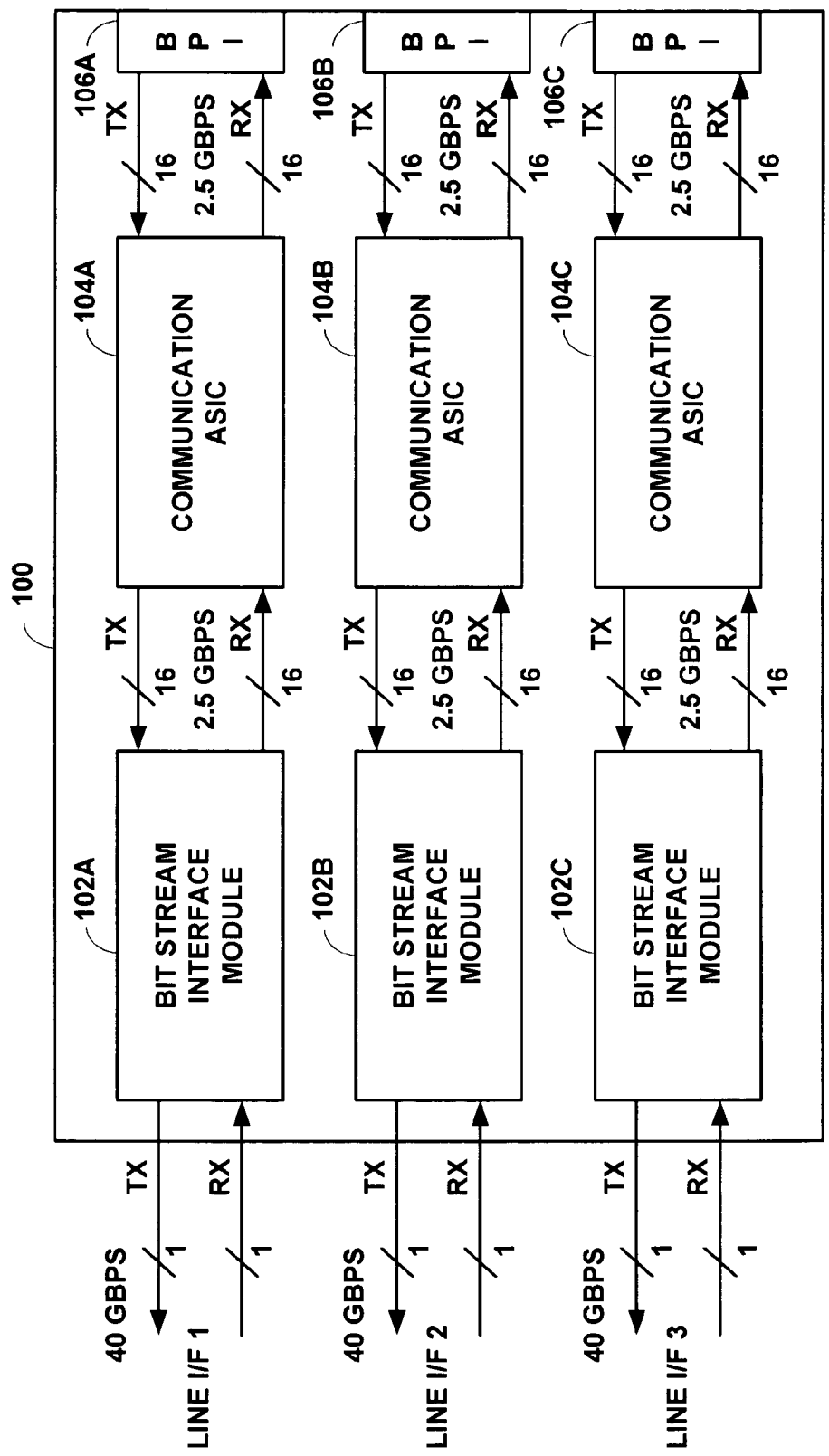
FIG. 1 is a block diagram illustrating a Printed Circuit Board (PCB) that has mounted thereon a plurality of Bit Stream Interface Module (BSIMs) constructed according to the present invention.

FIG. 1 illustrates with a block diagram a Printed Circuit Board (PCB) that has mounted thereon a number of Bit Stream Interface Module (BSIMs) constructed according to the present invention. As shown in FIG. 1, PCB 100 includes BSIMs 102A, 102B and 102C. PCB 100 also includes mounted thereupon communication Application Specific Integrated Circuits (ASIC) 104A, 104B, and 104C. PCB 100 mounts within a housing that services switching requirements within a particular location or geographic area. Each of the BSIMs 102A, 102B, and 102C couples to a high-speed media such as an optical fiber via a respective media interface and supports the OC-768 or the SEC-768 standard at such media interface. On the second side of the BSIMs 102A through 102C, the SFI-5 interface standard is supported. Communication ASIC 104A through 104C may communicate with other PCB components located in the housing via back interfaces 106A through 106C.

BSIMs 102A through 102C may be removably mounted upon PCB 100. In such case, if one of the BSIMs 102A through 102C fails it may be removed and replaced without disrupting operation of other devices on PCB 100. When BSIMs 102-102C are removably mounted upon PCB 100 and received by a socket or connection coupled to PCB 100. Further, in such embodiment, BSIMs 102A-102C may be constructed on a separate PCB.

Figure 2A:
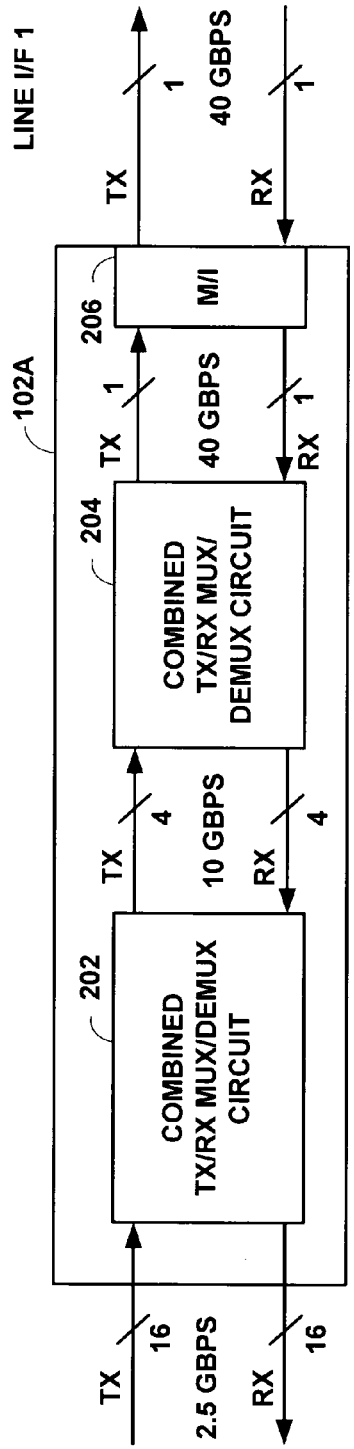
FIG. 2A is a block diagram illustrating one embodiment of a BSIM constructed according to the present invention.

FIG. 2A illustrates one embodiment of BSIM 102A. BSIM 102A of FIG. 2A includes a first combined TX/RX multiplexer/demultiplexer circuit 202 and a second combined TX/RX multiplexer/demultiplexer circuit 204. On the line side of BSIM 102A, first combined TX/RX multiplexer/demultiplexer circuit 202 couples to a media, e.g., fiber optic cable or copper cable, via a media interface 206. Media interface 206 couples to combined TX/RX multiplexer/demultiplexer circuit 204 via a 40 GPS nominal bit rate, one bit transmit and one bit receive interface. TX and RX line medias themselves each support one bit 40 Giga bits-per-second (GBPS) nominal bit rate communications, such as is defined by the OC-768 and/or SEC 768 specifications of the OIF.

Combined TX/RX multiplexer/demultiplexer circuit 202 interfaces with a communication ASIC, e.g. 104A, via 16 TX bit lines and 16 RX bit lines, each operating at a nominal bit rate of 2.5 GBPS. Such interface supports a nominal total throughput of 40 GBPS (16 * 2.5 GBPS). The interface between combined TX/RX multiplexer/demultiplexer circuit 202 and combined TX/RX multiplexer/demultiplexer circuit 204 includes 4 TX bit lines and 4 RX bit lines, each operating at a nominal rate of 10 GBPS. This interface supports a nominal total throughput of 40 GBPS (4 * 10 GBPS). This interface may operate substantially or fully in accordance with an operating standard known as the Q40 operating standard. However, the teachings of the present invention are not limited to according to operation of the Q40 standard or is the description here intended to be a complete description of the Q40 standard itself.

Figure 2B:
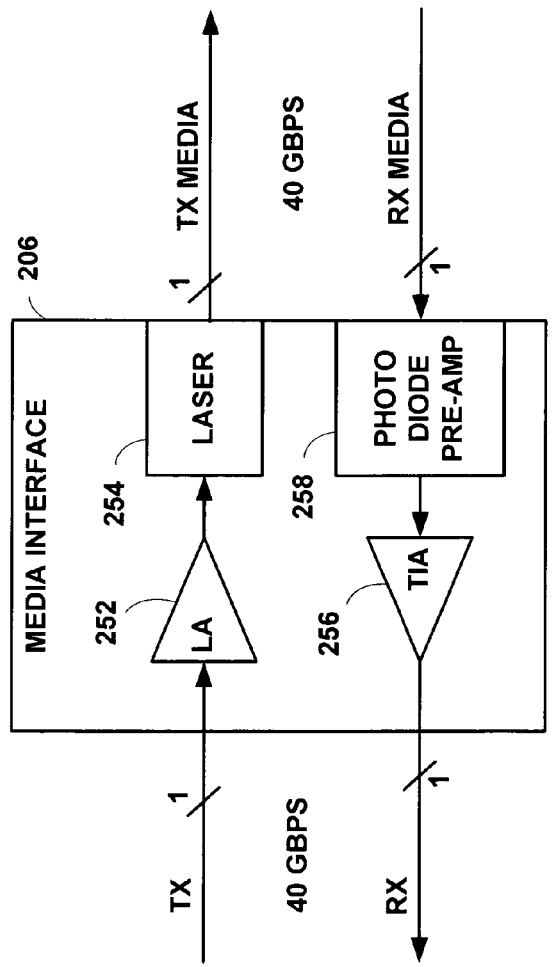
FIG. 2B is a block diagram illustrating an optical media interface that may be included with the BSIM of FIG. 2A.

FIG. 2B provides a block diagram illustrating an optical media interface that may be included with the BSIM of FIG. 2A. As shown in FIG. 2B, media interface 206 couples to an optical media on a first side and couples to the combined TX/RX multiplexer/demultiplexer circuit 204 on a second side. In the transmit path, media interface 206 receives a single bit stream at a nominal bit rate of 40 GBPS from combined TX/RX multiplexer/demultiplexer circuit 204. Limiting amplifier 252 amplifies the TX bit stream to produce a bit stream output coupled to laser 254. The laser produces an optical signal that is coupled to TX optical media.

On the receive side, an RX optical media produces the RX bit stream at a nominal bit rate of 40 GBPS. Photo diode/preamplifier combination 258 receives the RX bit stream and produces an output for transimpedance amplifier 256. Transimpedance amplifier 256 then outputs a single bit stream at a nominal bit rate of 40 GBPS for combined TX/RX multiplexer/demultiplexer circuit 204 of FIG. 2A.

Figure 3:
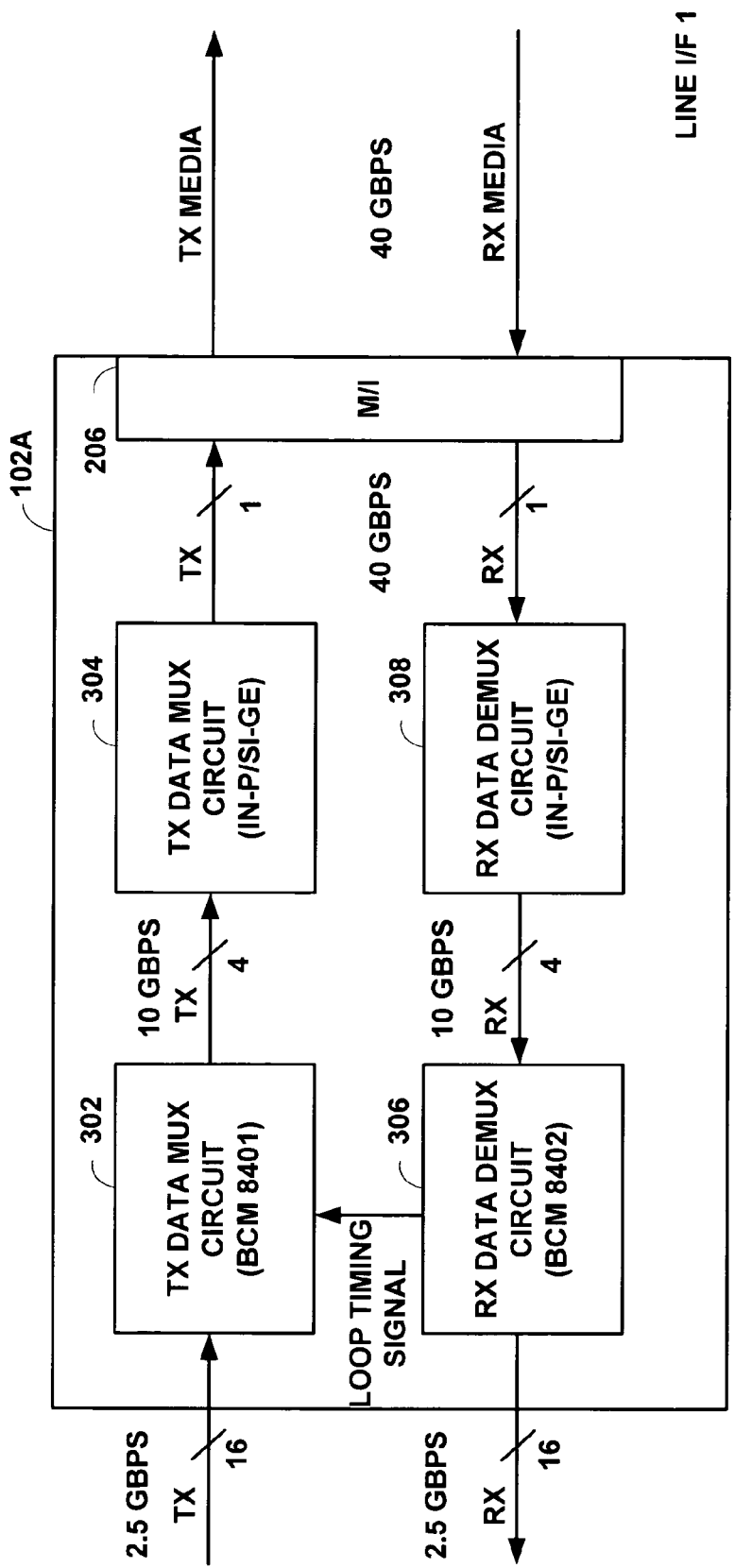
FIG. 3 is a block diagram illustrating another embodiment of a BSIM constructed according to the present invention.

FIG. 3 illustrate that separate TX and RX circuit components maybe employed. While media interface 206 of FIG. 3 is shown to be a single device such as shown in FIG. 2B, in other embodiments, the media interface 206 may be formed in separate circuits corresponding to separate TX and RX paths shown in FIG. 2B.

In the TX path, TX data multiplexer circuit 302 receives a 16 bit wide by 2.5 GBPS nominal bit rate input from a coupled ASIC and produces a 4 bit wide×10 GBPS nominal bit rate TX output. In the embodiment described herein, TX data multiplexer circuit 302 is constructed in a Silicon CMOS process, for example in a 0.13 micron CMOS process. The TX data multiplexer circuit 302 multiplexes the 16 bit wide by 2.5 GBPS nominal bit rate input to produce a 4 bit wide 10 GBPS nominal bit rate output, which is received by the TX data multiplexer circuit 304. TX data multiplexer circuit 304 multiplexes the 4 bit wide×10 GBPS nominal bit rate output to produce a single bit wide output at a nominal bit rate of 40 GBPS.

TX data multiplexer circuit 304 must switch at a frequency that is at least four times the rate at which TX data multiplexer circuit 302 must switch. For this reason, TX data multiplexer circuit 304 is constructed in an Indium-Phosphate, Silicon-Germanium or other like process that supports these required higher switching rates at the 40 GBPS output of TX data multiplexer circuit 304. The combination of TX data multiplexer circuit 302 constructed in a CMOS process and TX data multiplexer circuit 304 constructed in an Indium-Phosphate, Silicon-Germanium or other like process provides a high performance, relatively low cost solution with which to interface a 2.5 GBPS nominal bit rate 16 bit wide interface and a 40 GBPS 1 bit wide interface.

Likewise, in the RX path, bit stream interface module 102A includes an RX data demultiplexer circuit 308 that receives a single bit stream at a nominal bit rate of 40 GBPS data. RX data demultiplexer circuit 308 produces a 4 bit wide×10 GBPS nominal bit rate output for RX data demultiplexer circuit 306. In turn, RX data demultiplexer circuit 306 produces a 16 bit wide×2.5 GBPS nominal bit rate receive data stream.

As was the case with TX data multiplexer circuit 302 and TX data multiplexer circuit 304, RX data demultiplexer circuit 306 and RX data demultiplexer circuit 308 are formed in differing process types. In particular RX data demultiplexer circuit 306 is constructed in a Silicon CMOS or other like process that supports the relatively low switching rates. Further, RX data demultiplexer circuit 308 is constructed in an Indium-Phosphate, Silicon-Germanium, or other like process that supports the higher switching speeds.

Figure 4A:
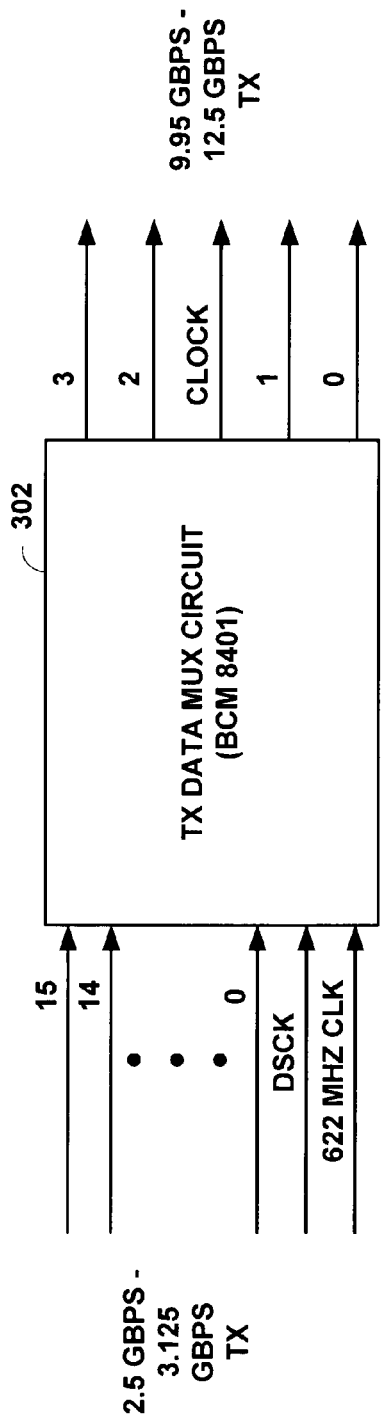
FIG. 4A is a block diagram illustrating a TX data multiplexer circuit constructed according to the present invention.

FIG. 4A depicts a block diagram that illustrates a TX data multiplexer circuit. As shown in FIG. 4A, TX data multiplexer circuit 302 receives 16 bit steams of data at nominal bit rate of 2.5 GBPS on each bit line from the communication ASIC 104A. Each bit line of this 16 bit wide interface operates at bit rates of up to 3.125 GBPS. This interface also includes a DSCK clock and 622 MHz clock. The output of the TX data multiplexer circuit 302 includes 4 bit lines, each of which supports a nominal bit rate of 10 GBPS. However, the output of the TX data multiplexer circuit can produce data at bit rates between about 9.95 GBPS and 12.5 GBPS. TX data multiplexer circuit 302 also produces a clock signal at one-half the nominal bit rate of the 4 bit stream paths. In such case, when the nominal bit rate of the data paths is 10 GBPS, the clock will be produced at 5 GHz.

Figure 4B:
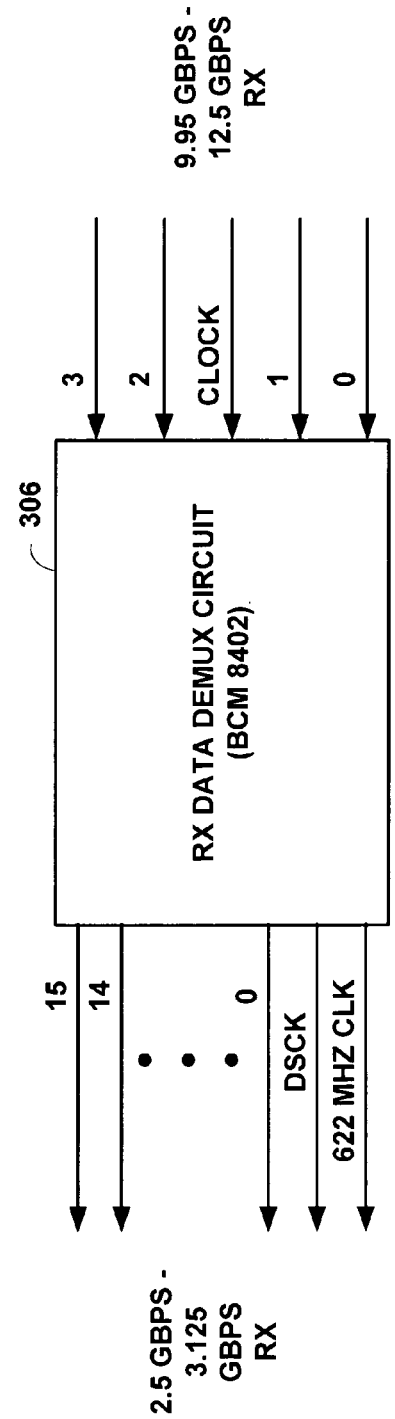
FIG. 4B is a block diagram illustrating an RX data demultiplexer circuit constructed according to the present invention.

FIG. 4B is a functional block diagram illustrating RX data demultiplexer circuit 306. As shown, RX data demultiplexer circuit 306 receives 4 bit streams at nominal bit rates of 10 GBPS each but operates between about 9.95 GBPS and 12.5 GBPS. RX data demultiplexer circuit 306 produces 16 bit stream outputs at a nominal bit rate of 2.5 GBPS. However, RX data demultiplexer circuit 306 may produce 16 bit streams output at a bit rate between about 2.25 GBPS and 3.125 GBPS.

Figure 5:
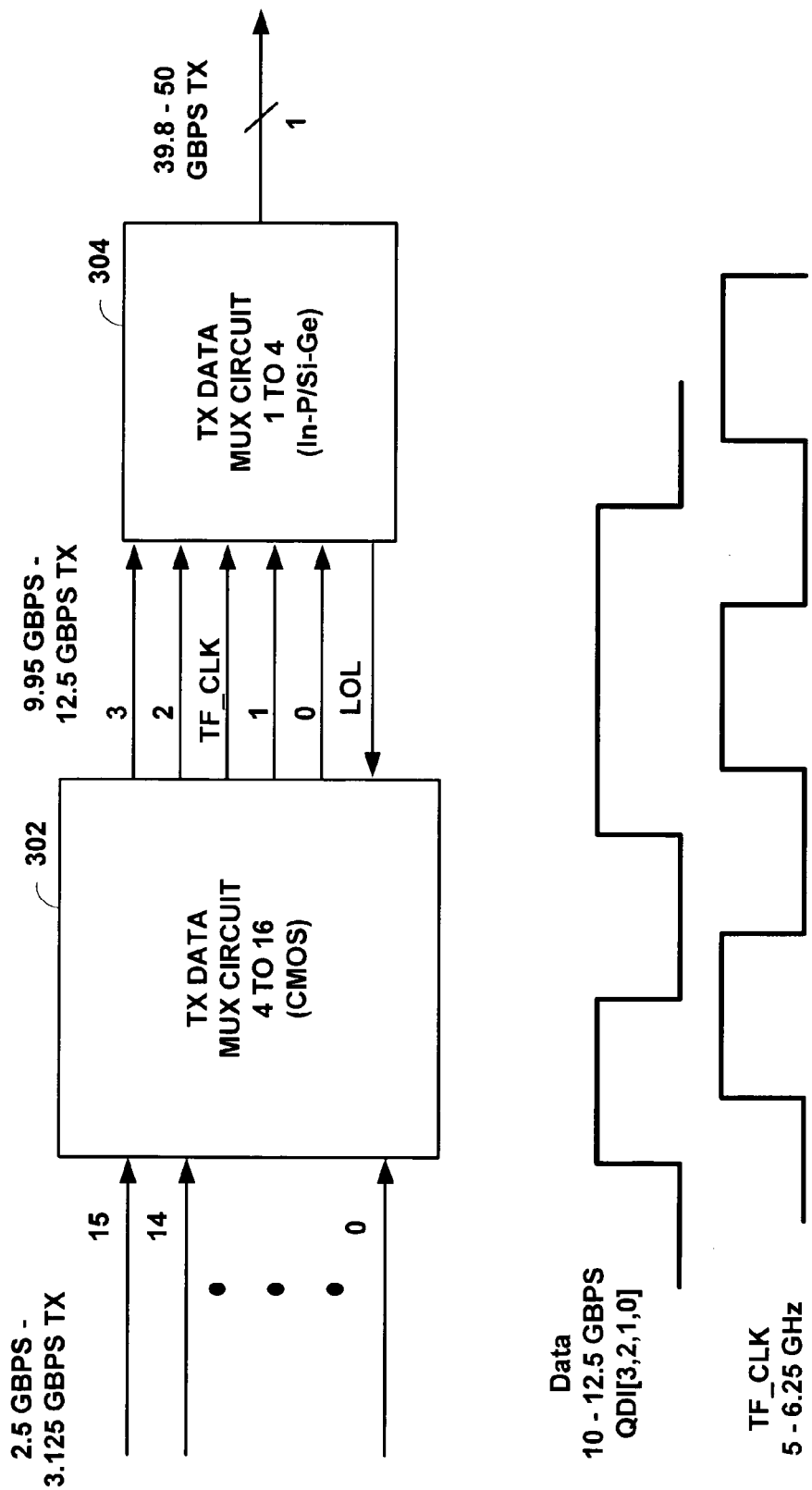
FIG. 5 is a block diagram illustrating the RX data demultiplexer circuits of FIG. 3 and the interfaces serviced thereby.

FIG. 5 is a block diagram depicting RX data demultiplexer circuit 306 coupled with RX data demultiplexer circuit 308 of FIG. 3 and the interfaces serviced thereby. As is shown in FIG. 5, RX data demultiplexer circuit 308 receives a single bit stream at a nominal bit rate of 40 GBPS. However, the single bit stream input may operate at bit rates between about 39.8 GBPS and 50 GBPS. Each RX data demultiplexer circuit performs a 1 to 4 demultiplexing operation on the received single bit stream to produce 4 output bit streams for each input bit stream. RX data demultiplexer circuit 308 produces output at bit rates between about 9.95 GBPS and 12.5 GBPS.

RX data demultiplexer circuit 306 receives 4 bit streams having nominal bit rates of 10 GBPS each, a QCLKI signal, and a RX_LOL signal from RX data demultiplexer circuit 308. Based upon these input signals, RX data demultiplexer circuit 306 produces 16 bit stream outputs at nominal bit rates of 2.5 GBPS. Also shown in FIG. 5, the QCLKI signal operates at one-half the frequency of the bit rate of the data stream received from RX data demultiplexer circuit 308. Thus, in such case, for the nominal bit rate of 10 GBPS, the QCLKI signal will be provided at 5 GHz.

Skewing often occurs because the clock and data are both generated externally to RX data demultiplexer circuit 306, and because the data and clock signals must travel over PC board traces that likely will have varying lengths and therefore varying parasitic loads. Skewing occurs between the clock QCLKI and data the 4 bit streams generated by circuit 308. Given the high speed at which these inputs operate, there is very little room for delay caused by mismatches between the clock and data signals. Without a signal delay method, the clock data relationship cannot be guaranteed to comport with the specifications established for that relationship. Further, because each of the data paths is unique across the PCB, it is highly likely that, even though the RX data demultiplexer circuit 308 produces data that is aligned upon transmission, the data will not be aligned upon receipt by the RX data demultiplexer circuit 306.

FIG. 6 includes a table and a diagram that illustrate operating specifications for the RX interface between the RX data demultiplexer circuits 308 and 306 of FIG. 3. As shown in FIG. 6, the receiver input parameters are shown at 400 and an equivalent circuit thereupon is shown at 402.

Figure 7:
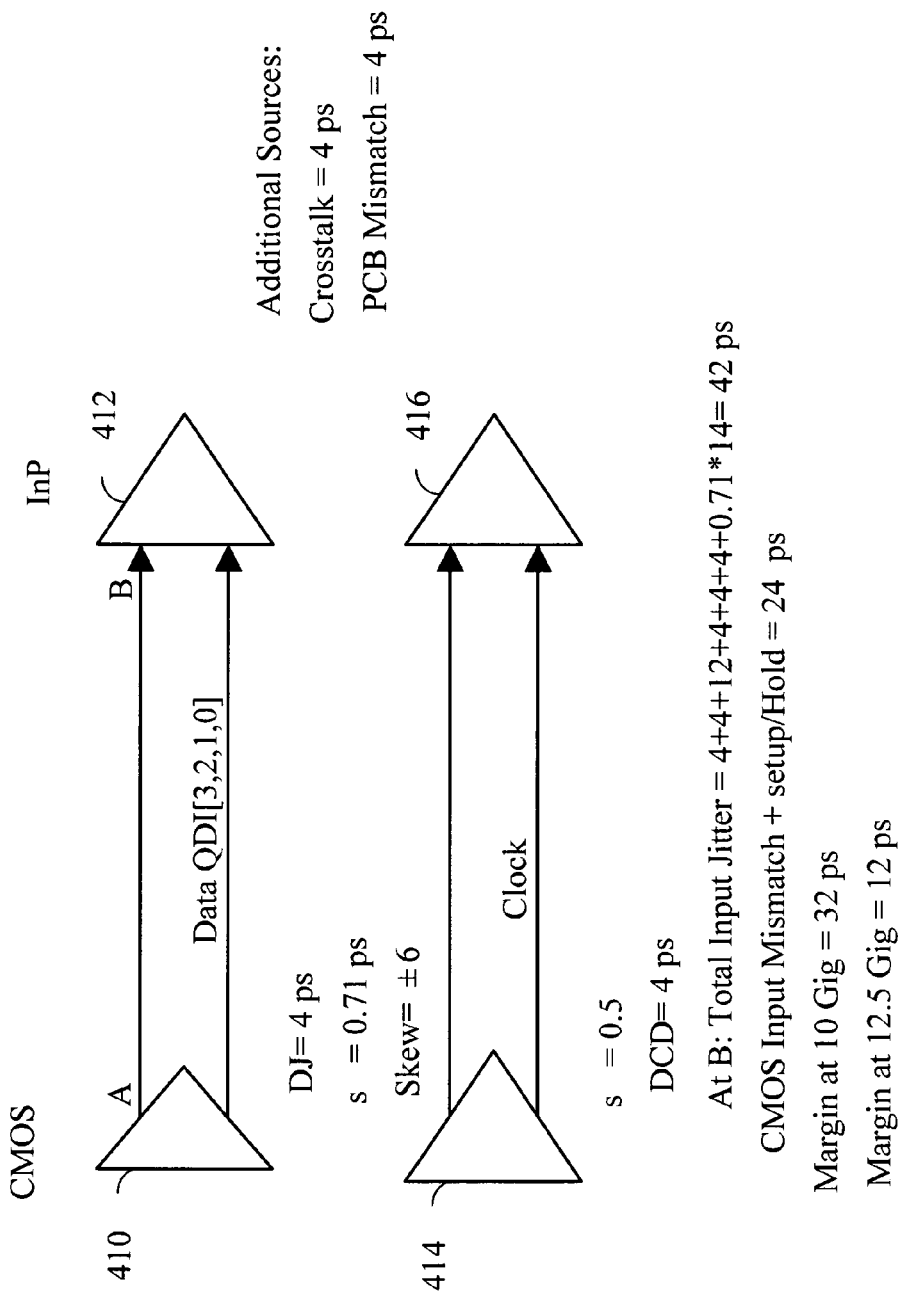
FIG. 7 is a block diagram illustrating the jitter allocation for the RX link between RX data multiplexer circuits of FIG. 3.

FIG. 7 provides a block diagram illustrating the jitter allocation for the RX link between RX data demultiplexer circuits 308 and 306 of FIG. 3. One of four data differential data line drivers 410 of the RX data demultiplexer circuit 308 and a differential clock driver 414 of the RX data demultiplexer circuit 308 on the 4 bit stream 10 GBPS side are shown. FIG. 7 also shows one of four data input buffers 406 of the RX data demultiplexer circuit 306 and a clock input buffer 412 of the RX data demultiplexer circuit 306. As is indicated, deterministic jitter for the data interface is specified as a maximum of 8 picoseconds. Further, the skew or non-deterministic jitter in the data lines is limited to ±8 picoseconds. The additional information provided in FIG. 7 shows how these jitters may be summed to result in maximum jitters.

Figure 8:
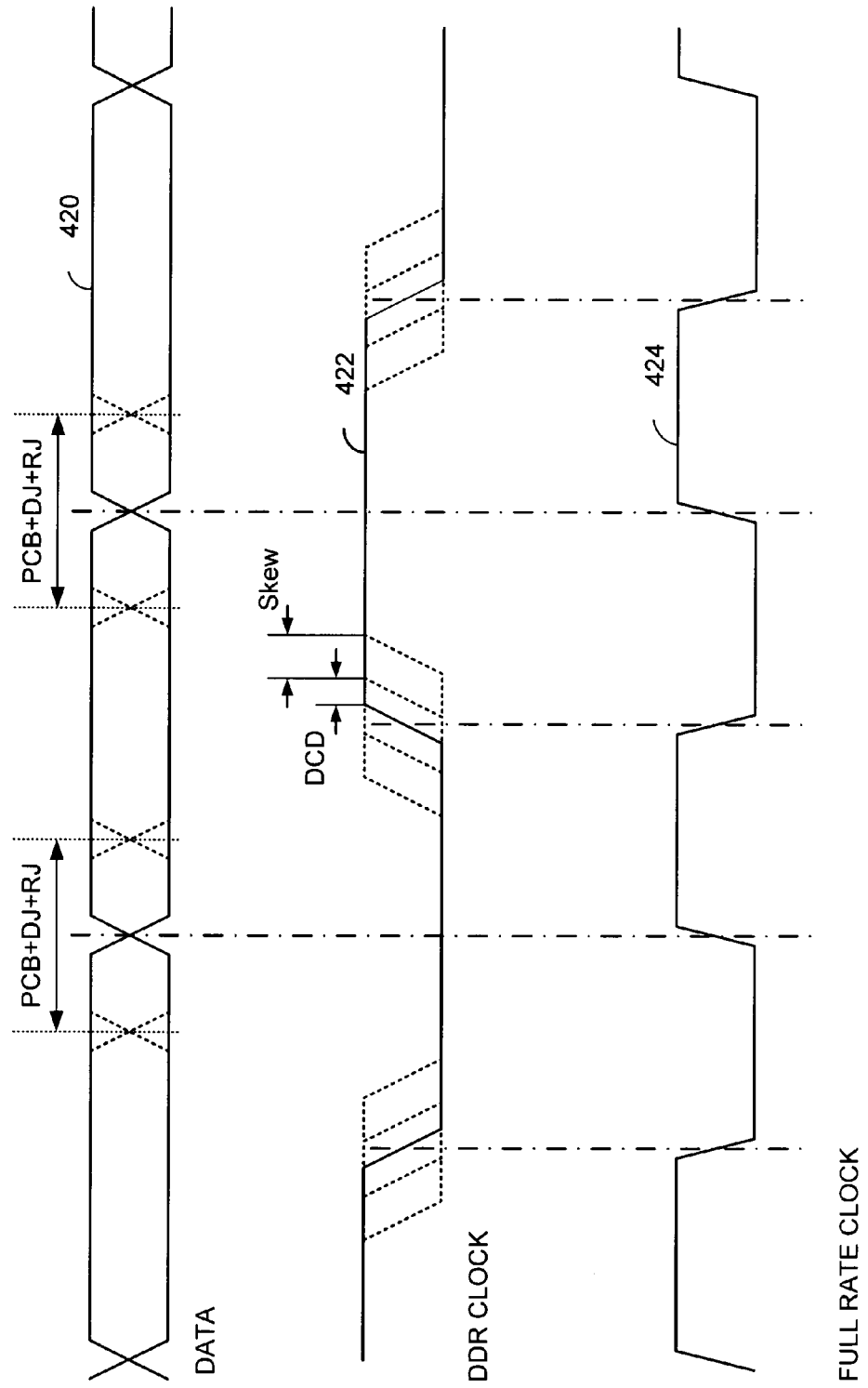
FIG. 8 includes timing diagrams illustrating the set up and hold operations on the 4 bit wide×10 GBPS links between the RX data demultiplexer circuits of FIG. 3.

FIG. 8 provides a timing diagram illustrating the set up and hold operations on the 4 bit×10 GBPS links between the TX data demultiplexer integrated circuits 306 and 308 of FIG. 3. In particular, the diagram illustrates the jitter relationships and definitions of the data 420, the DDR clock 422 and a full rate clock 424.

There is little or no room for error regarding clock and data between the clock arriving at the various multiplexers/demultiplexers of the above described data conversion circuits.

Figure 9A:
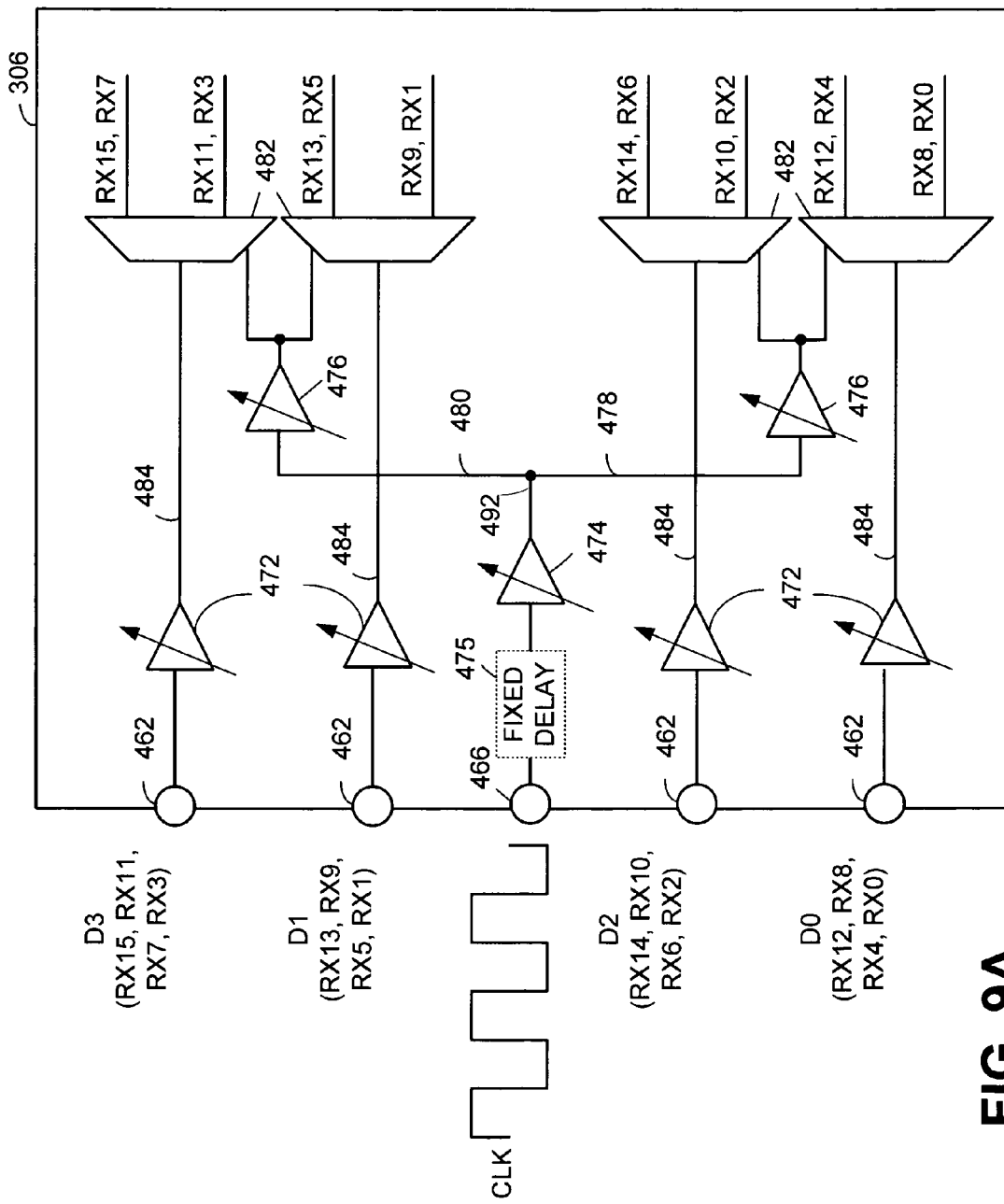
FIGS. 9A-9B illustrates various embodiments that compensate for signal skewing.

FIG. 9A provides a block diagram illustrating a signal delay compensation structure within demultiplexer circuit 306. Each delay element depicted must be tuned to the proper operating frequency. In this embodiment, a distributed programmable delay tree is utilized. Here, data lines D0-D3 are received at input ports 462. The clock signal is received at input port 466. In this instance, demultiplexers 482 demultiplex the data on the clock positive and negative going edges. However other clock schemes known to those skilled in the art may be utilized. As is illustrated, the demultiplexer integrated circuit 306 receives data on four data lines, D3, D2, D1, and D0. Data line D3 carries RX data bits RX15, RX11, RX7, and RX3. Data line D1 carries RX data bits RX13, RX9, RX5, and RX1. Data line D2 carries RX data bits RX14, RX10, RX6, and RX2. Data line D0 carries RX data bits RX12, RX8, RX4, and RX0. A second level of demultiplexers (not shown) is required to produce 16 data lines, each carrying a single RX data bit.

First level delay elements 472, which must be tuned to the circuits operating frequency, adjust the various data signals within a certain delay range. For example, the delay element may be designed to allow plus or minus 10 picoseconds. Delay element 474, located in trunk 492 of the clock circuit, compensates for a skew component common to the clock provided to all demultiplexers 482. This component is typically the predominant component of the skew. Delay element 474 corrects a combination of skew created internally and will match the clock. As described further below, delay element 474 also includes an adjustment to compensate for permissible variations in the operating frequency of the clock signal. Delay element 474 provides a variable delay. Fixed delay element 475 may also be included, which adds a fixed delay in addition to the variable delay provided by delay element 474. This element is depicted within FIGS. 10A and 10B but is not required. One manner in which fixed delay element 475 provides this fixed delay is via a serpentine path between input port 466 and variable delay element 474. However, other techniques known to those skilled in the art may be used to achieve the necessary delay.

Second level delay elements 476, must similarly be tuned to the same operating frequency, couple to delay element 474 via branches 478 and 480. These branches 478 and 480 may be symmetrical. The output of second level delay elements 476 clocks demultiplexers 482. The delays provided by the second level delay elements 476 may be separately controlled to provide selected delay levels to the clock prior to being applied to their individual demultiplexers 482. The second-level delay elements 476 and 478 compensate for a secondary component of the clock/data skew specific to their downstream demultiplexers. Thus, in one embodiment, the delay range is designed to be plus or minus 10 picoseconds. Thus, a total clock delay of plus or minus 20 picoseconds is distributed over the two levels of delay elements, the first half being applied to the clock globally, and the other half being applied to the clock locally. Another delay element, not shown, may provide compensation for skewing associated with each individual demultiplexer 482.

Figure 9B:
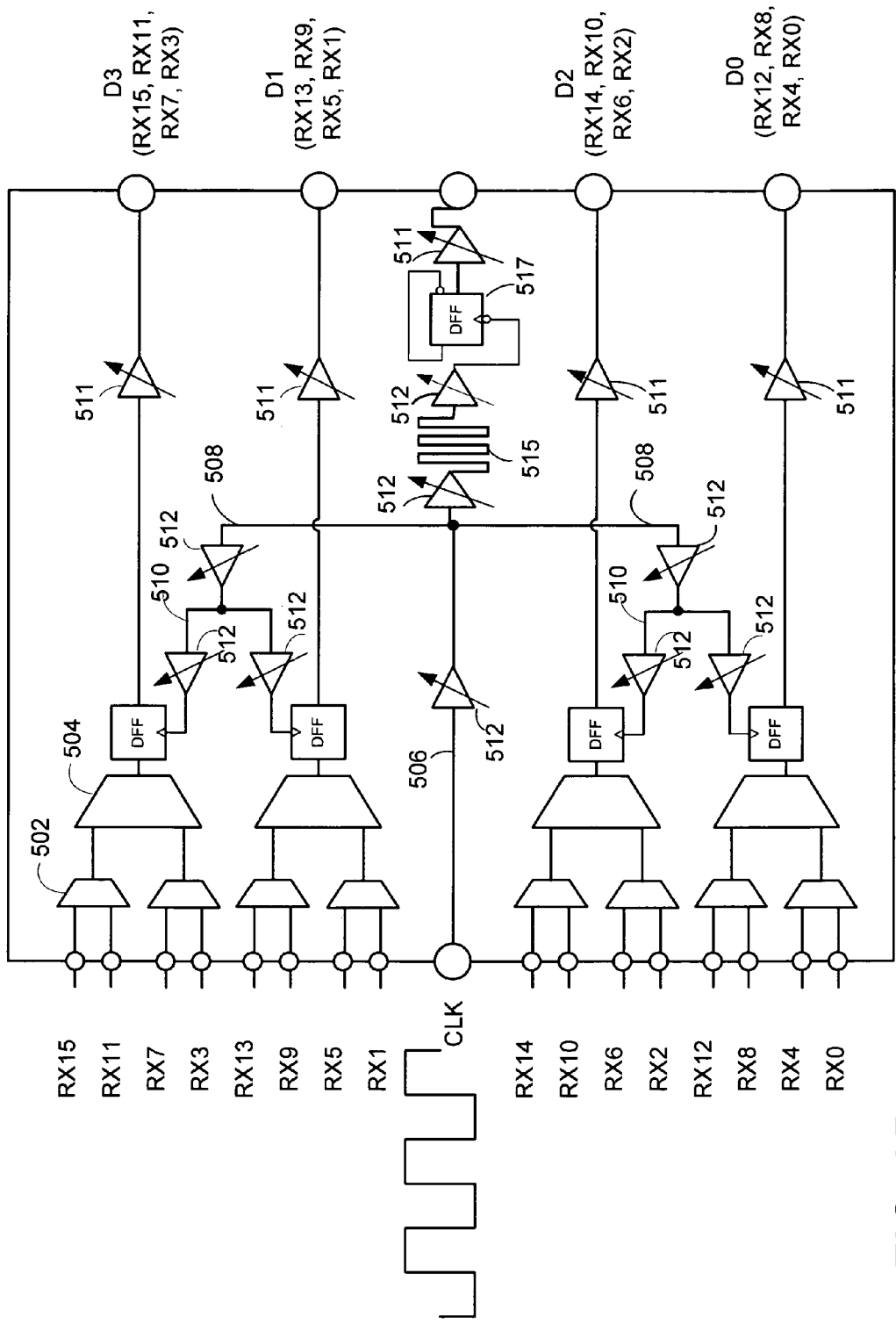

The range of delay provided by these delay elements overcomes the difference in the clock/data skew between the various lines caused by PC board designs, package mounting, or internal circuit pathway designs. The layout of the multiplexers and demultiplexers of the data conversion circuits of the present invention cause addition clock/data skew and data/data skew. FIGS. 9A-9B compensate for skew caused by both internal and external variations in path length. By symmetrically laying the data circuit pathways 484 about the distributed clock signal, skew caused by non-symmetry internal to the integrated circuit maybe reduced. Delay elements, having internal output drivers tuned to the specified operating frequency, provide fine-tuning of delay to further reduce these problems. Although symmetry may eliminate or reduce the need for delay elements within the clock distribution circuit, a need for these delay elements and their internal output drivers may exist.

FIG. 9B depicts a multiplexing circuit utilizing a symmetrical distributed clock. Here, 16 data lines are provided as input to a first set of multiplexers 502, for example from the communication ASIC 104A-104C. These multiplexers 502 output to a second set of multiplexers 504. In one embodiment, multiplexer 504 operates with a 5G clock whose clock input is not shown. The output of multiplexers 504 inputs to retimers 509, wherein these retimers again have internal output drivers, which must be tuned to the desired, operating frequency. These multiplexers allow a four to one multiplex function to take place, wherein the 16 inputs provided are reduced to four outputs on lines D0-D3. Retimers or DFFs 509 ensure the data is properly aligned in time to the output clock signal.

As shown, the clock is distributed from a central trunk 506 to a first set of branches 508. Branches 508 further divide into branches 510 which provide the clock signal to DFFs 509. In this way, the clock signal is uniformly distributed to DFFs 509 while minimizing skewing. Symmetrical distribution of the clock signal reduces or minimizes skewing by having each clock signal pathways have substantially equal transmission times. The clock signal may be further distributed to a downstream circuit through the port coupled to divider circuit 517. In one embodiment, DFF 517 has a feedback loop and acts as a divide by two circuit that allows a 10G clock to be reduced to a 5G clock. Additionally, DFF circuit 509 and DFF 517 may be triggered on opposite edges of the clock signal to ensure that the data outputs DO-D3 are centered with respect to the outputted clock signal. For example, DFFs 509 may trigger on the rising edge while DFF 517 triggers on the falling edge.

Each branch may contain variable delay elements 512 that allow the clock signal distributed to individual DFFs 509 to account for skewing that occurs due to differences in any given clock circuit pathway. Retimers reduce data skewing and are triggered by the leading edge of the clock signal provided to DFFs 509. The delay elements may be used to entirely compensate for any skewing. These delay elements or retimers must be tuned to the proper operating frequency. Further, variable delay elements 511 may be required to cause the output data signals D3, D2, D1, D0 to be aligned with the outputted clock signal.

The clock signal may be further distributed to a downstream circuit through the port coupled to divider circuit 517. Delay buffers 512, serpentine pathway 515, or other like methods, may delay the clock signal to ensure its integrity with respect to the data. DFF 517 and its associated feedback loop are triggered on the opposite edge of the clock signal from that used to trigger DFF 509. Triggering on the opposite edge and using a DFF that acts as a divide by 2 circuit automatically center the data outputted as D0-D3 centered with respect to the clock signal outputted by DFF 517. In the shown embodiment a 10G clock is reduced to a 5G clock. This allows the clock signal to be properly timed at the output port to the data signals.

Figure 10A:
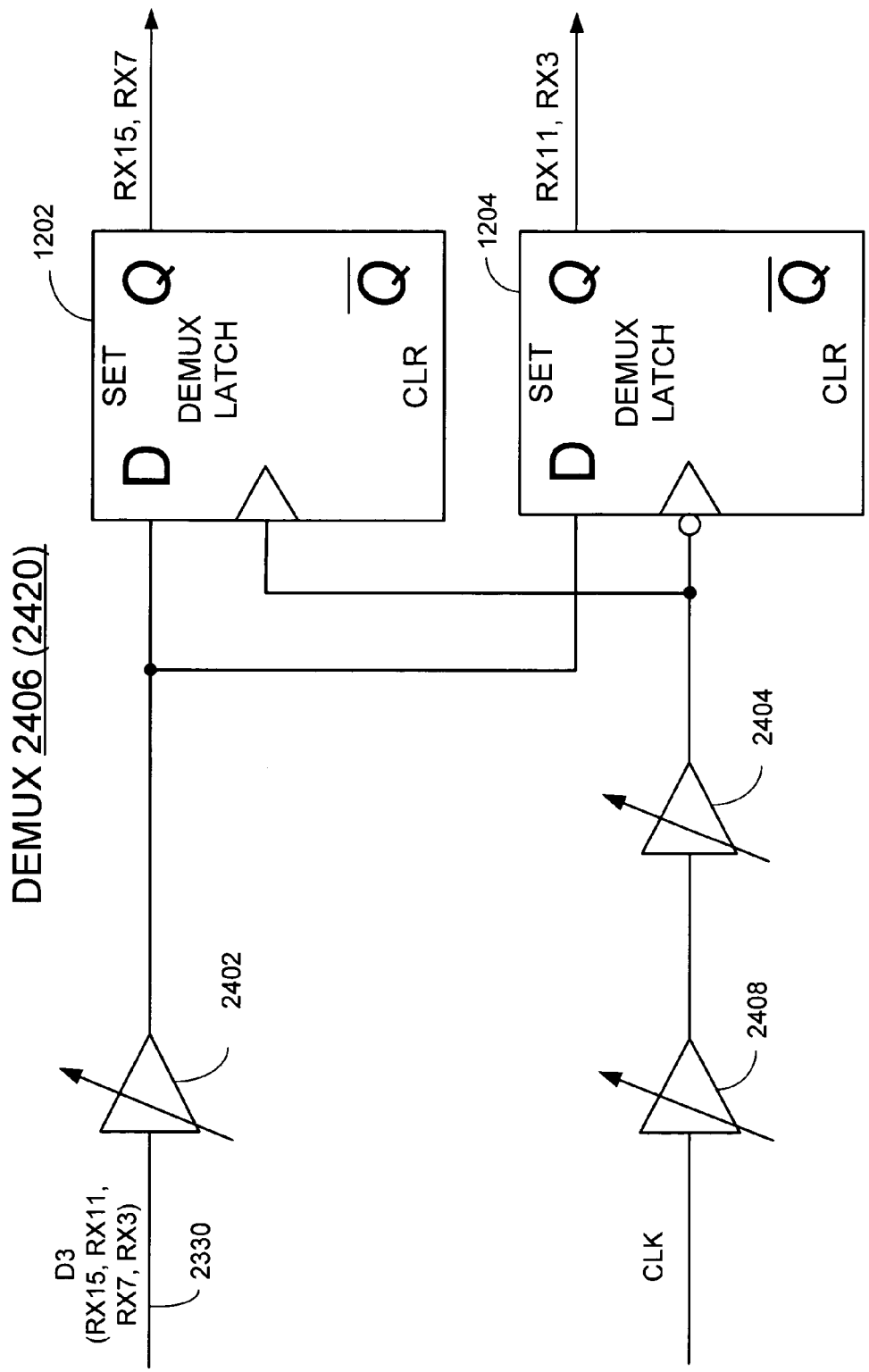
FIGS. 10A and 10B depict multistage demultiplexer circuits that utilize a VCO within a clock circuit.

The structure presented in FIG. 10A performs the demultiplexing function of demultiplexer pairs 2406, 2420. FIG. 10A also illustrates the relationship of the data and clock inputs to the delay elements 2402, 2404, and 2408. Demultiplexer latches 1202 and 1204 couple to the D3 data input and a common clock input from the output of second-level delay element 476. Demultiplexer latch 1202 is triggered by the positive edge of the clock and demultiplexer latch 1204 is triggered on the negative edge of the clock. On the positive edge of a first clock cycle, bit RX15 is latched into demultiplexer latch 1202 and provided as an output. On the negative edge of the first clock cycle, RX11 is latched into demultiplexer latch 1204 and provided as an output. During a next clock cycle bit RX7 is latched into demultiplexer latch 1202 on a positive edge and provided as an output while RX3 is latched into demultiplexer latch 1204 on a negative edge and provided as an output.

Figure 10B:
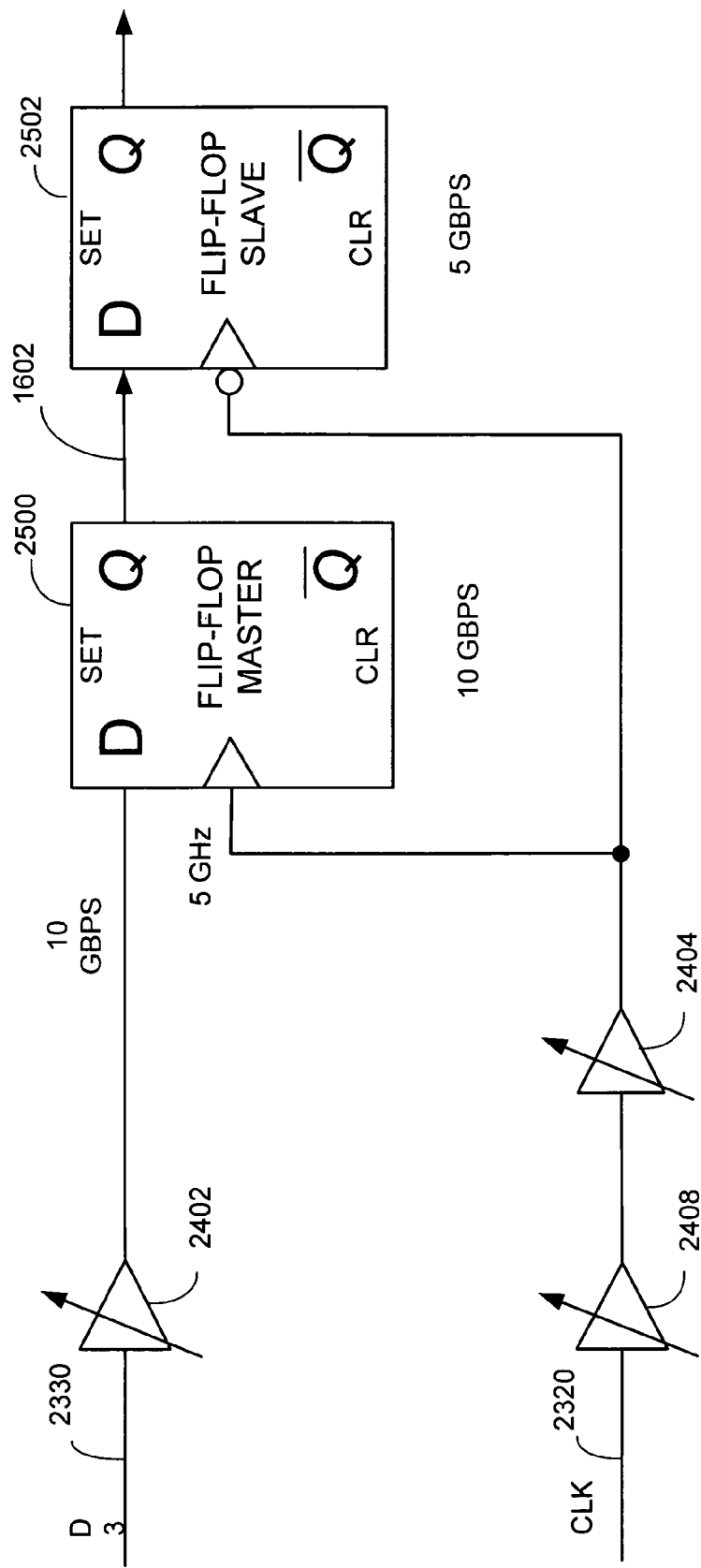

FIG. 10B is a block diagram illustrating a master/slave flip-flop arrangement used for the demultiplexer latches of FIG. 10A. This particular master/slave flip-flop arrangement is used for implementing the demultiplexer latches 1202, 1204 of demultiplexers 482. In typical applications, the D flip-flops that implement demultiplexer latches 1202, 1204 are clocked at the same rate as their incoming data. They are positive edge triggered, so the flip-flop master 2500 and flip-flop slave 2502 are also clocked at the same frequency as the incoming data D3 2330. In that case both the flip-flop master 2500 and flip-flop slave 2502 must operate at the data rate, which in the case of the RX data demultiplexer circuit 306, is 10 GBPS. As previously discussed, flip flops (and the latches contained therein) capable of operating at 10 GBPS in a conventional 0.13 μ CMOS process each requires two very large inductors to compensate for the parasitic capacitance that is problematic at such high frequencies of operation. Thus, in the example of the RX data demultiplexer circuit 306, four channels each having four demultiplexers, each having two D flip-flops, each having two latches translates to thirty-two very large inductors to implement the system at 10 GBPS. The die area for this implementation would be enormous and costly.

However, because the demultiplexers are set up to operate such that demultiplexer latches 1202, 1204 alternate clocking data from D3 2330, on opposite edges of a 5 GHz clock, the flip-flop slave 2502 of the demultiplexer latches 1202, 1204 can be implemented with a design that is required to operate at only 5 GHz. Flip-flop master 2500 still receives 10 GBPS data in over data line D3 2330, and therefore must still be able to read data at that rate (even though it clocks in only every other bit on the positive edge of the 5 GHz clock 2320). Because flip-flop slave 2502 is receiving only every other bit of D3 2330 at 5 GHz, and because it is only being clocked at 5 GHz, it is able to function with a design that need only accommodate a 5 GBPS data rate and 5 GHz clock. Such a design may be implemented in the conventional 0.13 μ CMOS process without need for an inductor. Thus, only half of the inductors would be needed (i.e. 16 rather than 32), which provides a tremendous saving in die area over a conventional demultiplexing flip-flop implementation.

Figure 10C:
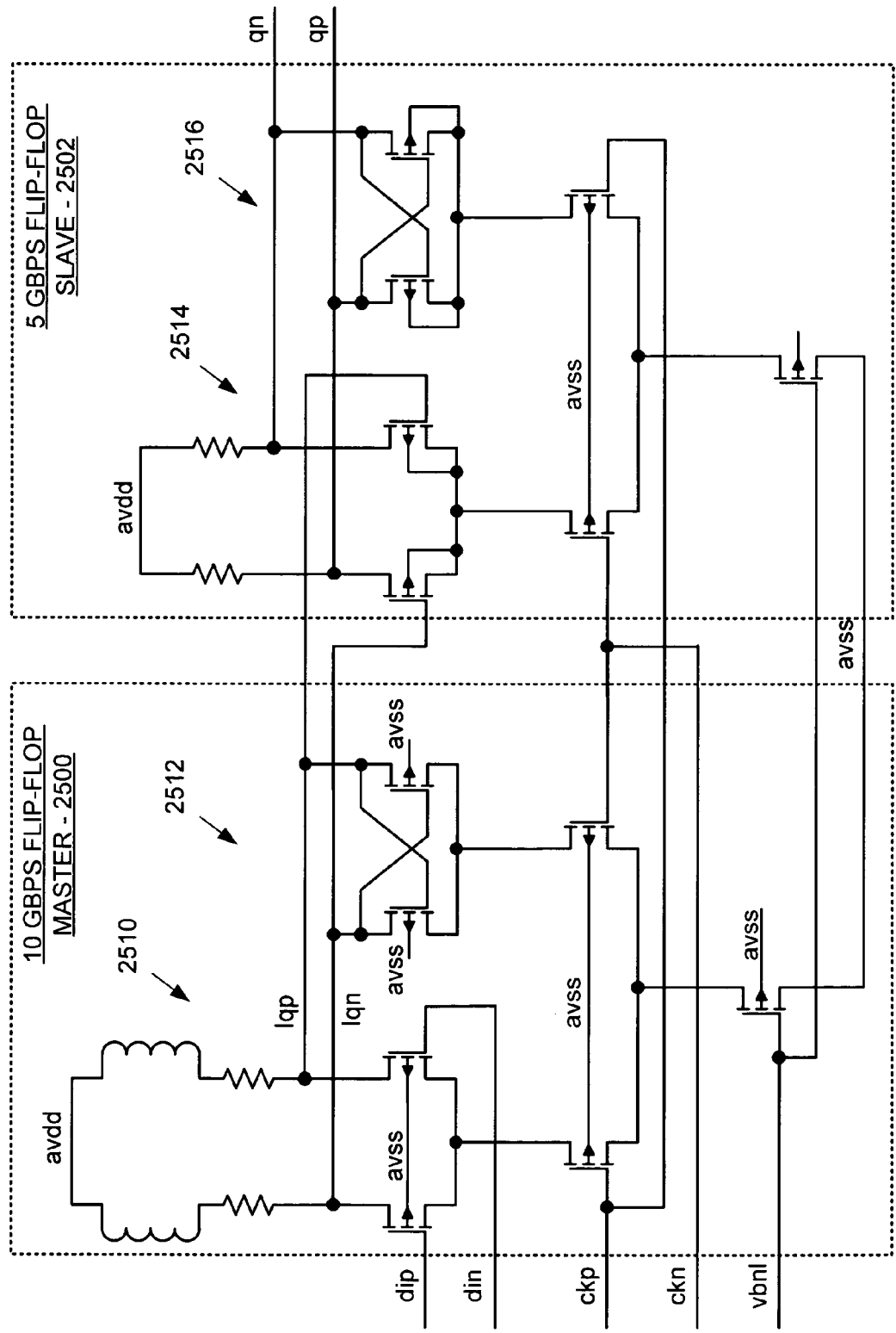
FIG. 10C is a circuit diagram illustrating the master/slave flip-flop arrangement of FIG. 10B, showing in detail the structure of the higher rate master flip-flop and the lower rate slave flip-flop.

FIG. 10C is a circuit diagram illustrating the master/slave flip-flop arrangement of FIG. 10B, showing in detail the structure of the higher rate master flip-flop 2500 and the lower rate slave flip-flop 2502. The circuit of FIG. 10C illustrated as a differential circuit. Demultiplexer latch 2500 includes a driver 2510 and a latch 2512. As is shown, the driver 2510 includes an inductor that allows the driver 2510 to switch at the higher data rate of 10 GBPS. As contrasted to the master demultiplexer latch 2500, a driver 2514 (coupled to latch 2516) of the demultiplexer latch slave 2502 does not include an inductor, which slows down its operation somewhat. However, the circuit supports switching at the 5 GHz rate, and because it is only being clocked at 5 GHz, it is able to function with a latch design that need only accommodate a 5 GBPS data rate and 5 GHz clock. Such a flip-flop may be implemented in the conventional 0.13 μ CMOS process without need for an inductor.

Figure 11:
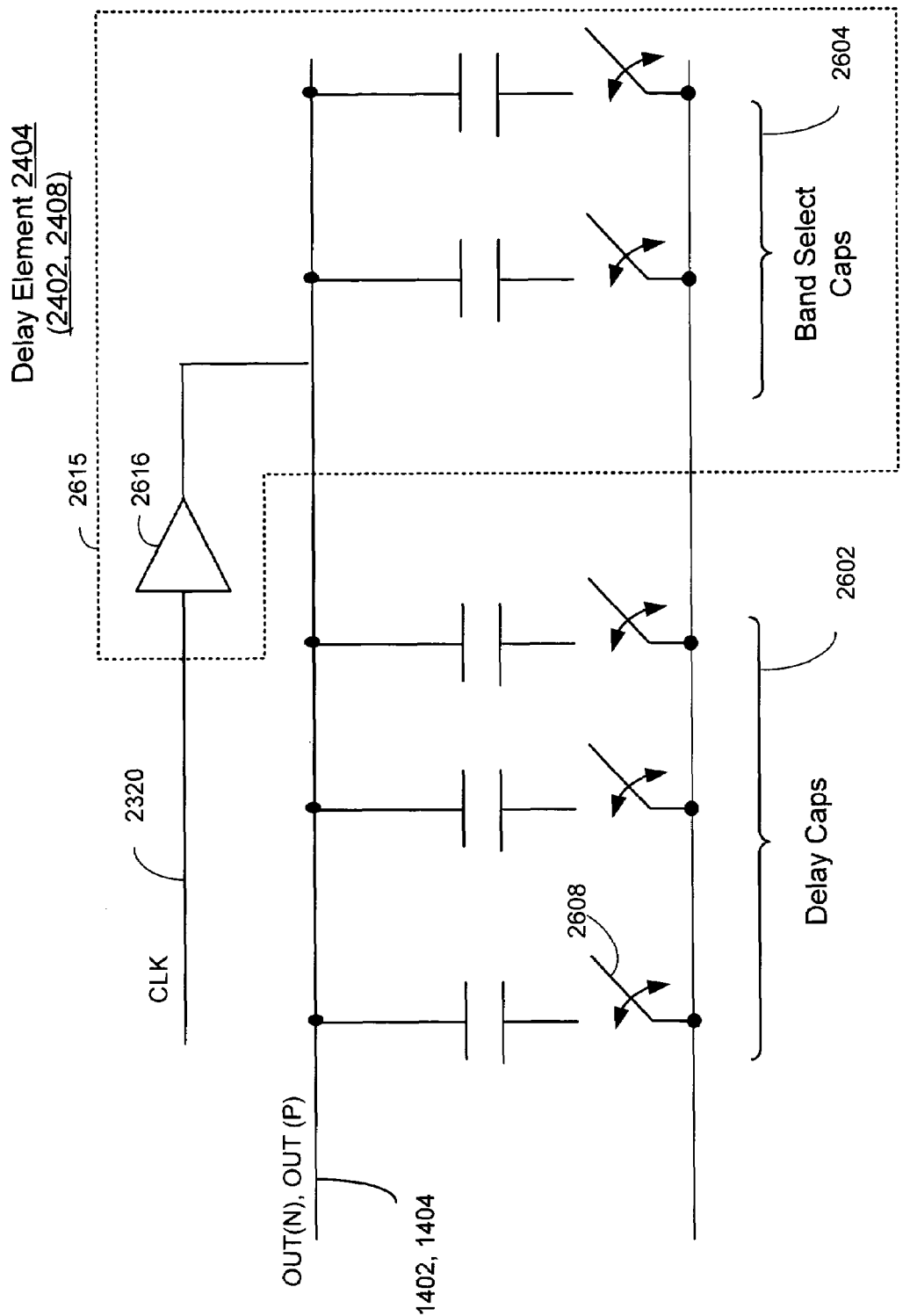
FIG. 11 is a circuit diagram illustrating a delay element constructed according to the present invention.

FIG. 11 is a circuit diagram illustrating a delay element (472, 474, and/or 476 of FIGS. 9A-9B and 10A-10B) constructed according to the present invention. The particular capacitance values illustrated in FIG. 11 are particular to one embodiment of delay element 474. Capacitors 2602 are introduced in increments to cause the delay element 474 to introduce corresponding delays. The total capacitive load introduced by the delay capacitors 2602 will increase or decrease the output response time of a tuned driver 2615. The total capacitance coupled to the output of the tuned driver 2615 by the delay capacitors 2602 can thus be controlled with an n-bit digital setting (the length of the setting will depend upon the total number of capacitors that make up the network), the bits of which each control one of the switches 2608. These bits may correspond to a tuning setting for the delay element.

Thus, the delay capacitors 2602 may be coupled to the output of the driver 2615 of the delay element in combinations of 0, 40, 80, 120, 160, 200, and 240 femto farads (ff, $10^{-15}$ farads). To produce a delay range of ±10 picoseconds of the delay element 474, the delay is normalized to the center position with a load of 120 ff. Thus, the clock edge can be retarded using additional capacitance, or it can be advance using less capacitance. The reader will appreciate that differing levels of delay may produced using different sized drivers and differing capacitor values.

Empirically, it can be determined what total delay range is to be provided for a particular application by examining the jitter specifications that must be met between the transmitting and receiving circuits, and the nature of the delays that are created in generating the clock and data signals as well as transmitting them between chips or circuit blocks. For the example, in RX data demultiplexer circuit coupled to an InP demultiplexer, it was determined that about 40 ps of total delay was needed to adequately compensate for skewing between clock and data for the Q40 interface previously discussed. It was also determined that because the clock signal was rendered sinusoidal in nature by the parasitic effects of the boards traces, it could be delayed the most without further degrading the quality of the clock signal. The data, on the other hand, became increasingly degraded based on the amount of delay imposed. Thus, the bulk of the delay adjustment was allocated to the clock signal, and the clock was placed in the middle of the delay structure between the two sets of data lines in order to facilitate the adjustment of the skew.

Once the total range of delay that is required for an application has been determined, the optimal settings for the capacitance arrays of all of the delays may be determined through a circuit test that varies the settings until the optimal setting is determined. Because variations in the clock/data relationship will remain reasonably constant, once a digital word representing the settings for all of the delays has been determined for the setting, it can be programmed into all of the data conversion circuits manufactured for a given board design and/or package. Programming of the delay capacitors 2602 can be accomplished by programming the word into a memory maintained in the circuit, or it could be programmed by the tester through fuse programmable links.

The amount of delay distributed among the delay elements of the delay structure of the invention will vary from one application to another. The specific example provided herein is therefore not intended to be a limitation, but only to be instructive in applying the invention to various applications. Moreover, although delays can be significantly greater for signal interfaces between chips, it is conceivable that such skews between internal circuit blocks could also benefit from application of the present invention.

As previously mentioned, in the example the of the RX data demultiplexer circuit 306 coupled to the InP demultiplexer circuit 308, the data rate is permitted to range between 9.9 GHz and 11.1 GBPS. The clock can also vary between 5 and 6.6 GHz. This fact introduces an additional effect on the clock/data relationship. Therefore, in the delay element 474 includes band-select capacitors 2604 that are coupled to the output of driver element 2616 are used to compensate for variations in the input clock and data rates.

Figure 12:
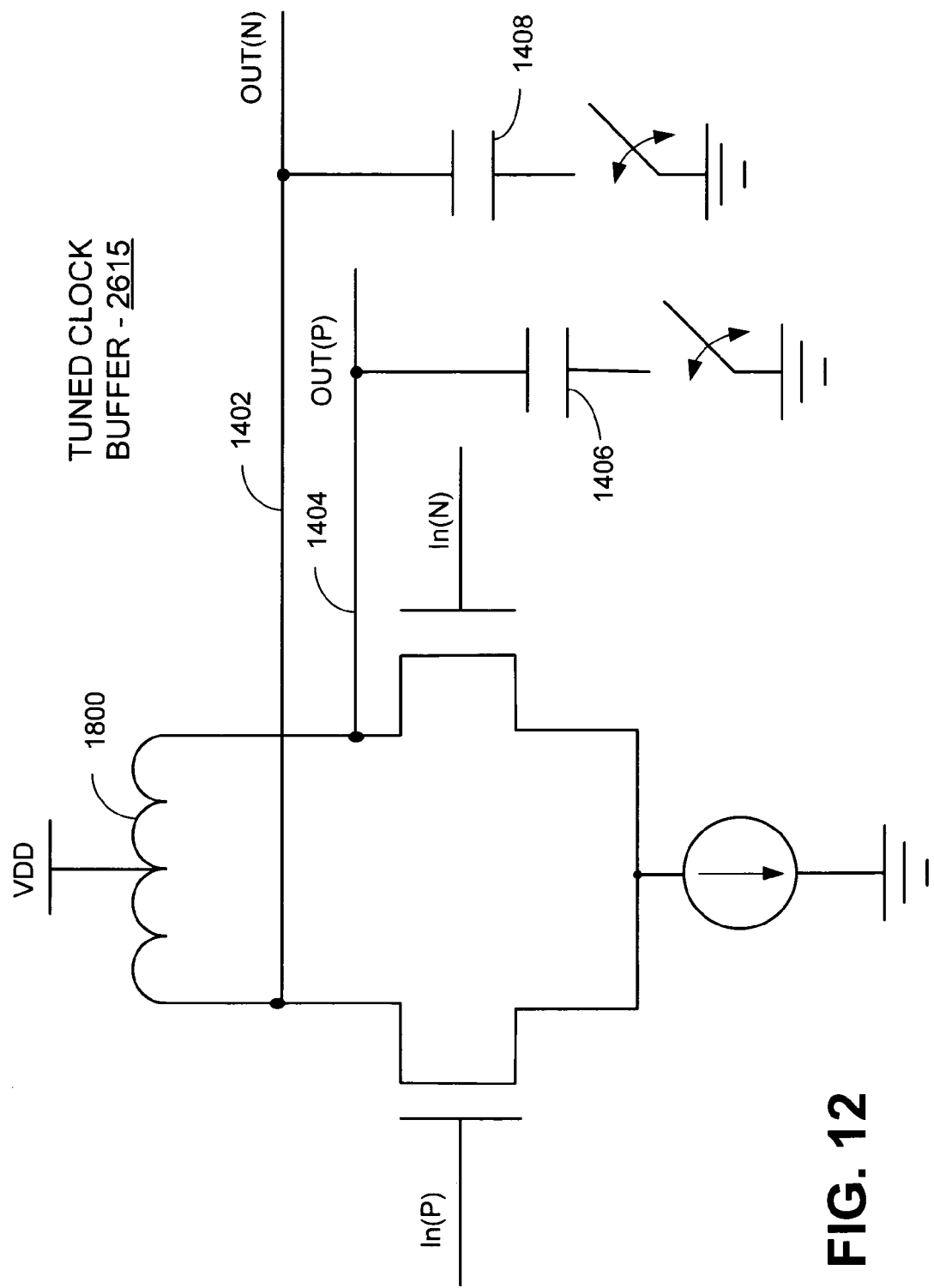
FIG. 12 is a block diagram illustrating a differential configuration of the delay element driver constructed according to the present invention.

FIG. 12 is a block diagram illustrating a differential configuration of the delay element driver 2615 constructed according to the present invention. Using a conventional buffer amplifier as the delay element driver 2615 of FIG. 12 (of the delay elements 2402, 2404) with center load impedance 1800 renders a particular response at the frequencies of the clock and data (i.e. 5 and 10 GHz respectively) that may be unsuitable for latching data into the demultiplexers (2406, 2420 FIG. 10) because a standard driver would not be able to drive the load of the demultiplexers 2406 and 2420 at those frequencies.

Thus, according to the present invention, each of the differential outputs OUT (N) 1402 and OUT (P) 1404 includes tuning capacitors 1406 and 1408 that are controlled based upon a selected frequency of operation. For simplicity, the delay element 2404 of FIG. 11 was shown single-ended. Readers will appreciate how delay element driver 2615 is illustrated in a double-ended fashion in FIG. 12. The delay element driver 2615 of FIG. 12 can be tuned using the band select capacitors 1406 and 1408 to cancel the effects of the inductive center load impedance 1800. It is imperative that the tuning capacitors or alternatively a varactor (not shown) must be properly tuned to the selected operating frequency. Typically, this is the same frequency of operation at which the VCO operates. If the drivers and tuning capacitors are scaled appropriately, capacitor settings consistent with tuning the VCO can be applied to the drivers to tune them automatically to the operating frequency.

Figure 13A:
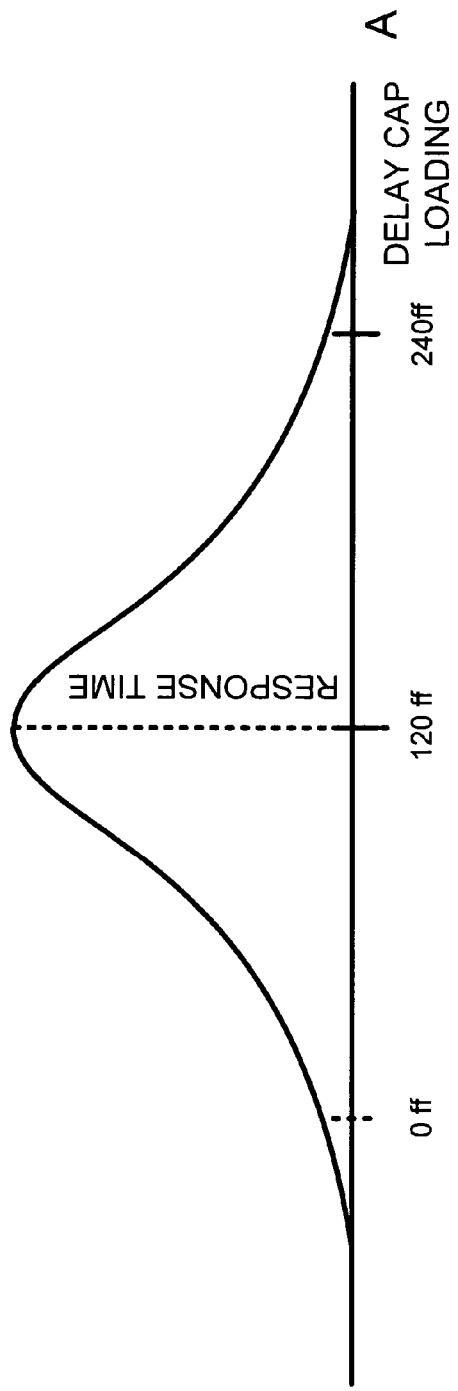
FIGS. 13A and 13B are response curves for the tuned delay element amplifier of FIG. 14 with high and optimized Q factors respectively.
Figure 13B:
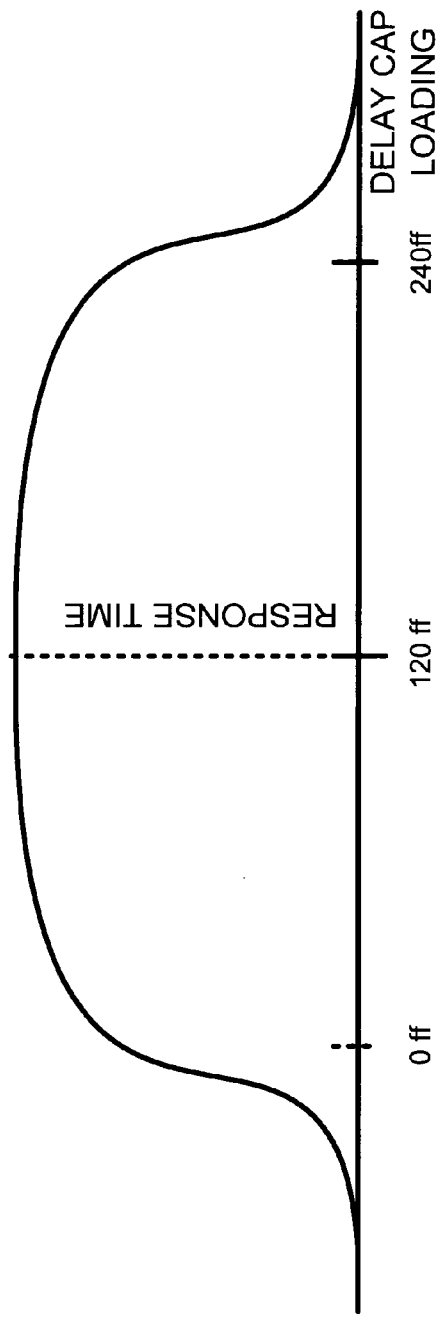

The quality factor (i.e. Q) of the tuned response of the delay element driver 2615 must be optimized. If the Q is too high, the response will look like that of FIG. 13A, where the gain of the buffer amplifier 2615 is sufficient at 120 ff delay capacitor 2602 loading, but is less than sufficient on either side of the center capacitance value of 120 ff. If the Q is lowered, the gain flattens out and remains sufficient over the entire range of the delay capacitor network 2602 as illustrated in FIG. 13B. The Q cannot be too low either, because the overall gain will begin to drop below a level that is adequate.

Figure 14A:
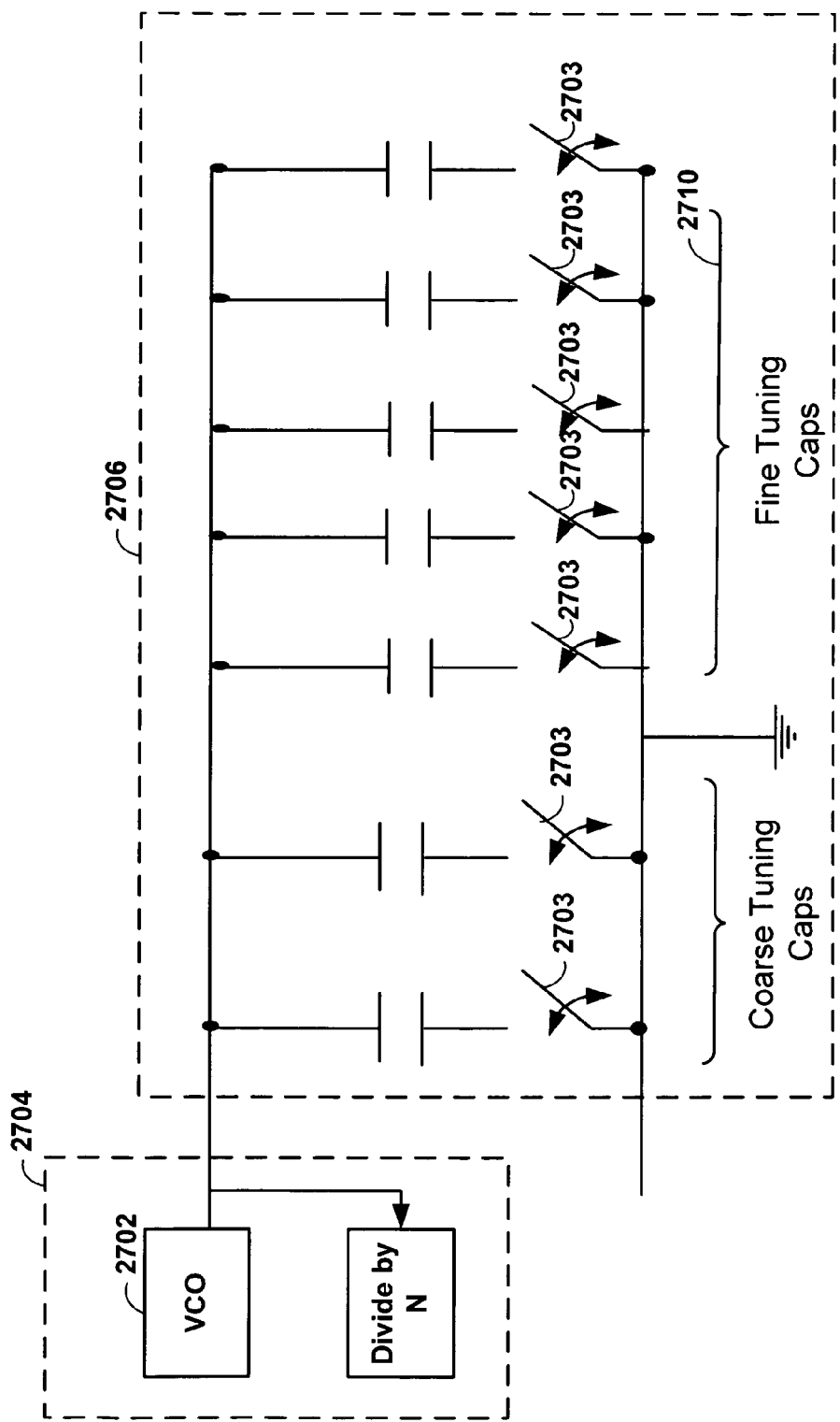
FIGS. 14A-14C depict tuning capacitor networks associated with a VCO.

FIG. 14A depicts VCO 2702 within a clock circuit 2704. A network of switched capacitors 2706 tunes VCO 2702. Switched capacitors 2706 tune VCO 2702 to operate at a desired operating frequency. This switched network of capacitors comprises coarse tuning capacitors 2708 or fine tuning capacitors 2710. Drivers in the previously described delay elements and data drivers or buffers also need to be tuned to operate at the same frequency as VCO 2702. To achieve this, one existing method individually tunes each driver. This creates a time consuming and difficult process by which each entire circuit is tuned. This disclosure teaches an improved method for tuning the individual drivers. Since VCO 2702 may be tuned with a switched network of capacitors wherein switch 2703 settings constitute a tuning setting for the selected operating frequency, the tuning setting may be transferred to tuning capacitors associated with the individual delay elements or output drivers in order to tune the output drivers to the same operating frequency as VCO 2702. This is possible since the capacitance values associated with switching network 2706 are consistent with a switched capacitor network associated with drivers like output driver 2615 of FIG. 11. Thus, consistent settings recorded from a tuned VCO may be supplied to the output driver.

Figure 14B:
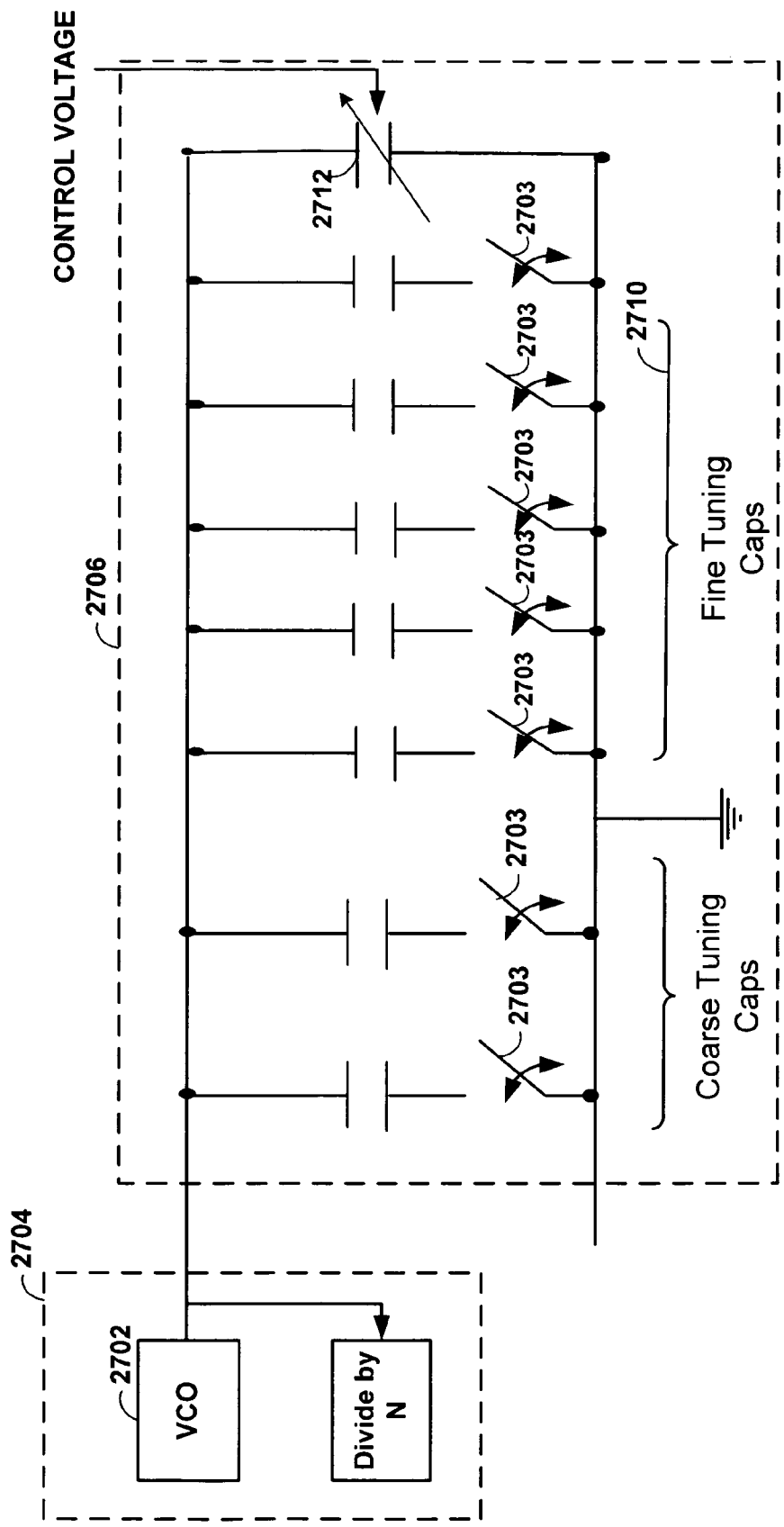

FIG. 14B depicts VCO 2702 that is tuned by a switched network of capacitors 2706, wherein this switched capacitor network may further comprise a varactor 2712 wherein the varactor settings may also be transferred to a varactor that tunes the output driver. Similarly, FIG. 14C depicts VCO 2702 that is tuned only by varactor 2712.

Figure 14C:
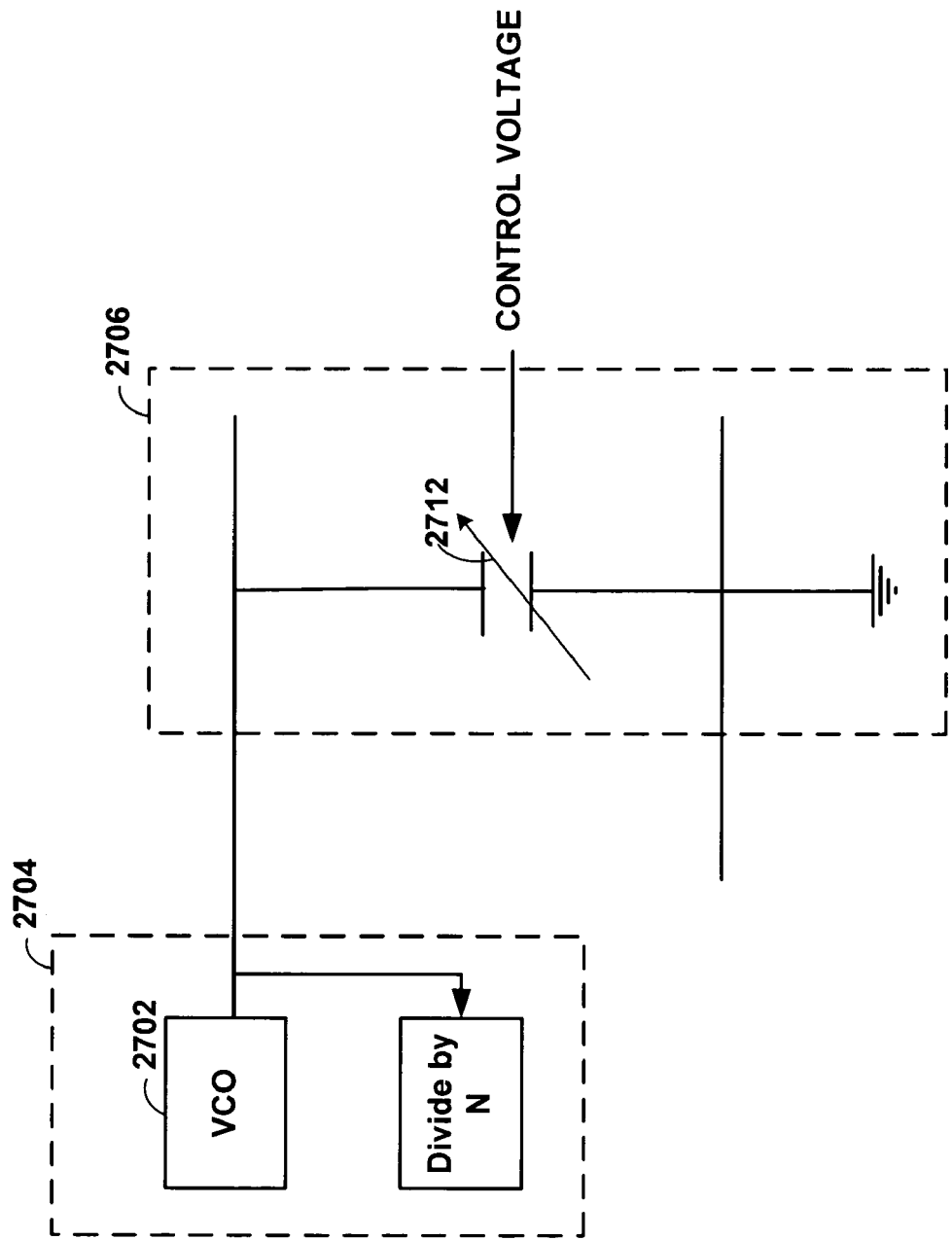
Figure 15:
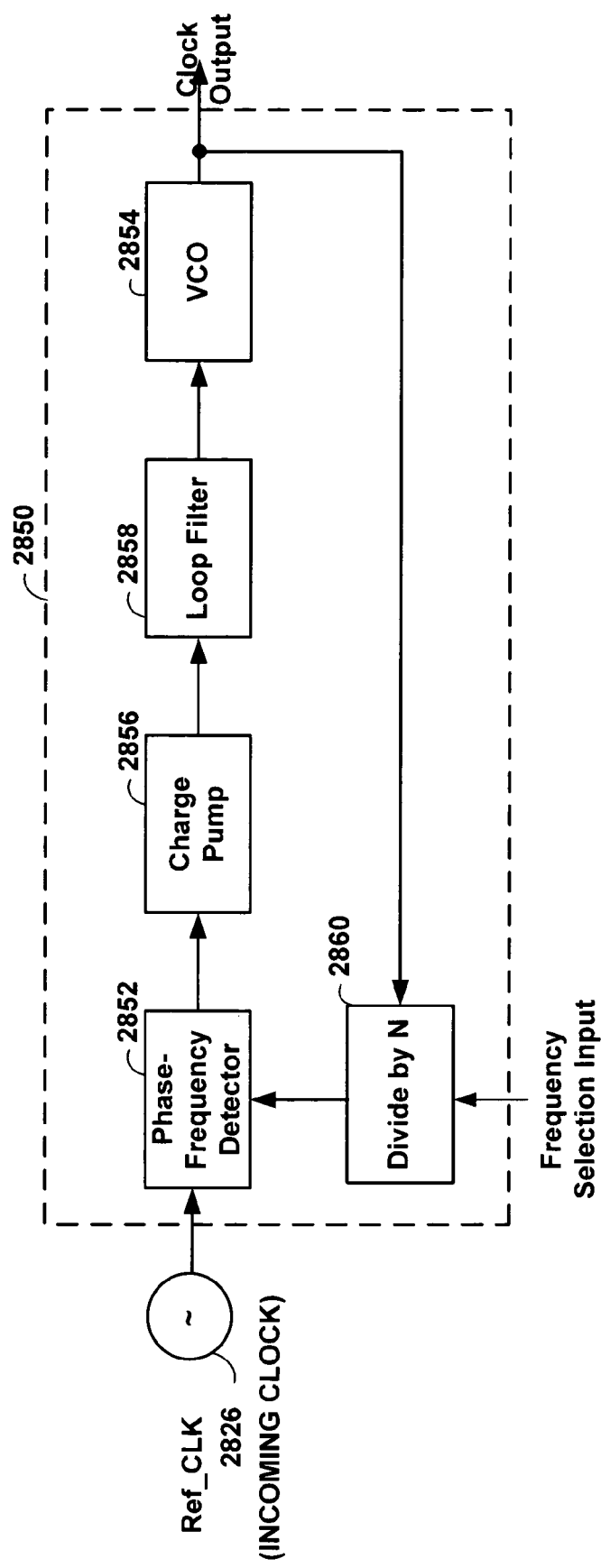
FIG. 15 is a block diagram illustrating an embodiment of a Phase Locked Loop that generates a clock signal and that includes a VCO constructed according one of a number of embodiments of the present invention.

FIG. 15 depicts a VCO, as depicted in FIGS. 14A-14C incorporated into a PLL within the cock circuit. A PLL forces the phase of the periodic signal at the output of its VCO to be approximately equal to the phase of the input signal. The only way these phases can be equal is for the frequencies of these signals to be equal as well. Therefore, a generic PLL guarantees that the frequency of the VCO is equal to that of its input. The use of a divider circuit allows the VCO frequency to be a multiple of that of the incoming signal. PLL 2850 receives an incoming clock signal such as that provided by reference clock 2826. Phase detector 2852 generates an error that is ideally proportional to the difference in phase between the loop input, INCOMING CLOCK, and the output of VCO 2854. Loop filter 2858 attenuates rapid variations in the error between the output of VCO 2854 and the INCOMING CLOCK, and provides this input to charge pump 2856. Divide by N circuit 2860 accounts for difference in the VCO output and INCOMING CLOCK frequency.

The VCOs in FIGS. 16A-16D may be incorporated into the previously discussed clock circuits. In one embodiment the VCO is used to produce a Reference Clock Signal based on a number of inputs that include the first bit stream data clock, wherein the Reference Clock Signal latches data from the first bit stream(s). The inputs to the clock circuit may further include a Loop Timing Clock Signal; an External Reference Clock Signal; a Reverse Clock Signal provided by an external data conversion circuit; or other like signals. This clock circuit includes a phase locked loop (PLL) with a phase detector that receives the first bit stream data clock and a loop output.

Figure 16A:
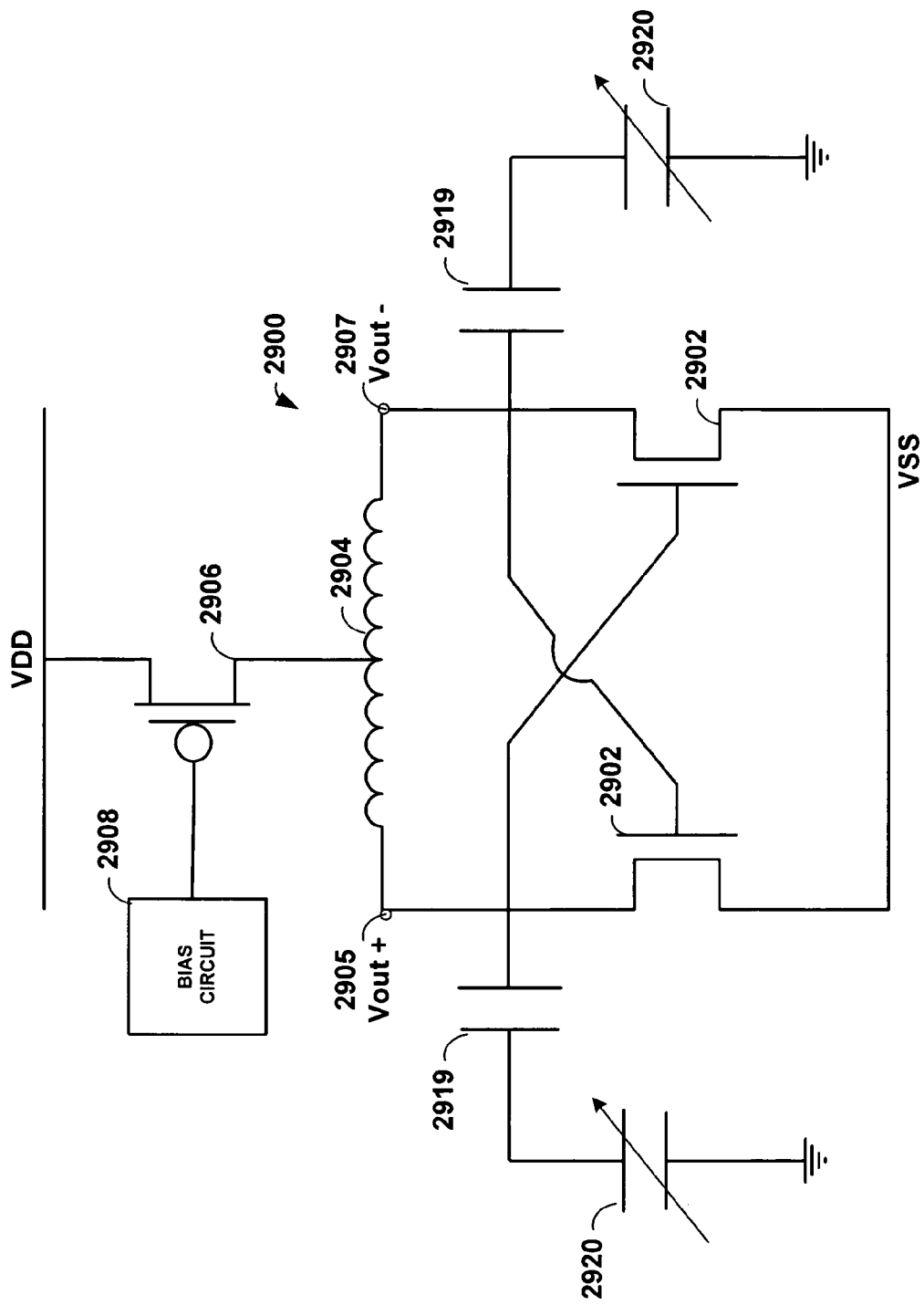
FIGS. 16A-16D depict various embodiments of VCOs used within clock circuits coupled to various embodiments of filtering circuits.

FIG. 16A illustrates a typical VCO comprising a pair of cross-coupled transistors 2902 and an inductor 2904. Although several VCO's are illustrated in FIGS. 16A-16D, other VCO's known to those skilled in the art may be used. Inductor 2904 is coupled to the cross-coupled transistors 2902 and the output of the VCO 2900 is the differential across inductor 2904 taken at terminals 2905 and 2907. Bias voltage to the circuit inputs via transistor 2906. Any noise within the current supplied to inductor 2904 affects the oscillation phase noise of the circuit. Thus, it is important to reduce noise associated with the supplied bias voltage, power supply or transistor 2906. As previously discussed, such noise can adversely affect the VCO output signal. As shown, transistor 2906 is a pFET type transistor, while transistors 2902 are nFET type transistors. VCO 2900 is subject to 1/f noise and white noise from transistor 2906, bias voltage, and power supply. Varactors 2920 are used to tune the VCO frequency. Capacitors 2919 are ac-coupling capacitors that are mainly employed to isolate DC voltage from 2905 and 2907 to the varactors 2920.

Figure 16B:
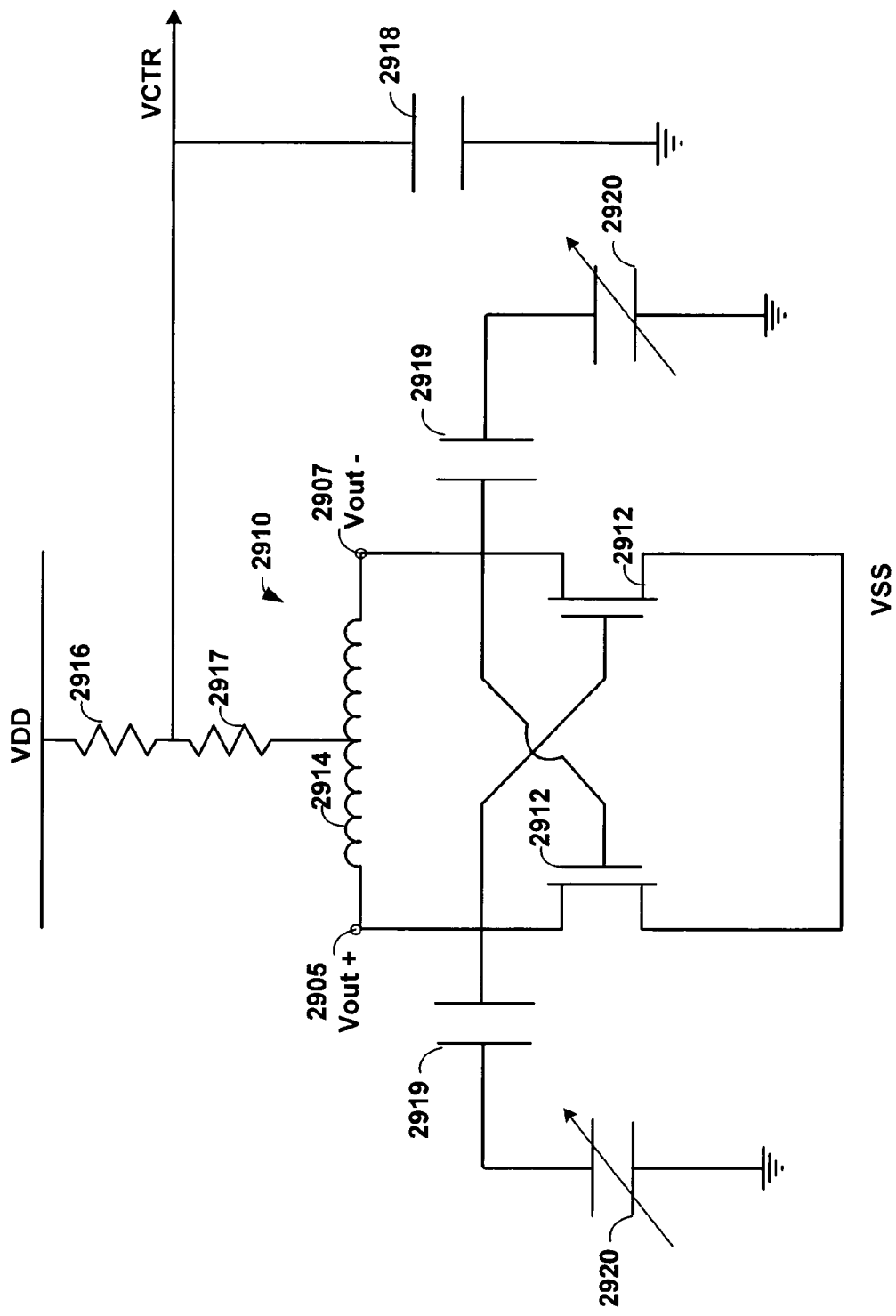

FIG. 16B depicts one embodiment wherein VCO 2910 comprises a pair of cross-coupled transistors 2912. The output of the VCO is taken across i terminals 2905 and 2907. As shown in FIG. 16B, a resister 2916 and capacitor 2918 form an RC filter to reduce noise associated with power supply inputted to VCO 2910 Note that 1/f noise and white noise associated with the transistor 2906 and its biases used to supply the bias current to VCO 2900 as depicted in FIG. 8A does not exist in FIG. 8B. Additionally, the filtering node, VCTR, may be brought out of the chip to connect to a larger capacitor for better filtering. This clean voltage may be used as a clean control voltage for other purposes. As in FIG. 16A, the output of VCO 2910 is taken as the differential across inductor 2914. It is also important to note in FIG. 16B that the voltage applied to 2910 between the inductor and VSS may be dropped or reduced by using resistor 2917. This resistor also functions to raise the voltage at VCTR. As with FIG. 16A, it is important to reduce noise supplied to the circuit since such noise can adversely affect the VCO output signal. As stated above, capacitors 2919 are ac-coupling capacitors that are mainly employed to isolate DC voltage from 2905 and 2907 to the varactors 2920.

Figure 16C:
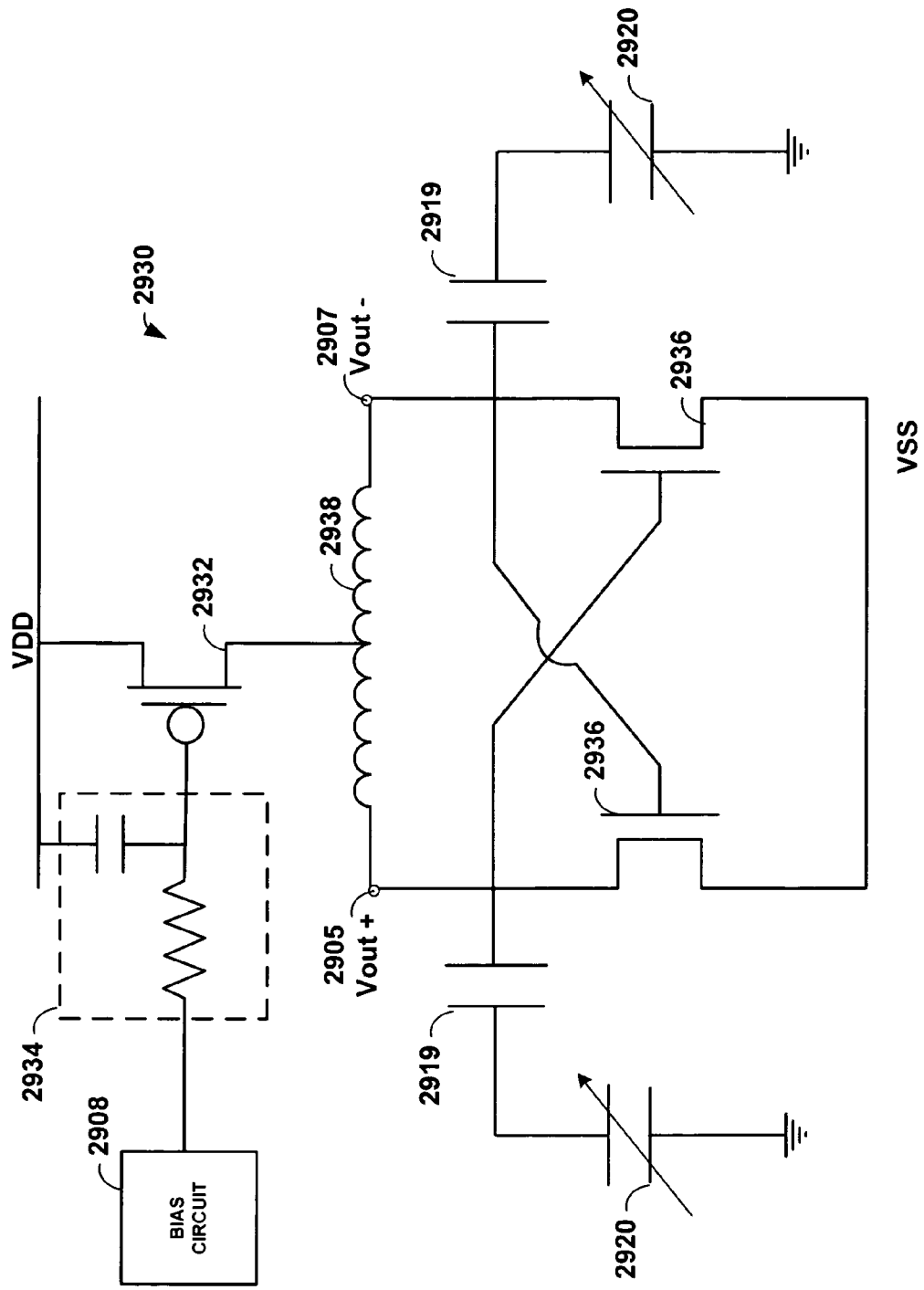

FIG. 16C depicts VCO 2930 that is susceptible to noise from a power supply or bias circuit 2908, as well as noise from pFET transistor 2932. This noise is filtered or reduced by RC filtering circuit 2934 coupled to the bias circuit and pFET transistor 2932. As discussed previously, VCO 2930 comprises a pair of cross-coupled transistors 2936 and inductor 2938. The output of VCO 2930 is taken as the differential across inductor 2938 at terminals 2905 and 2907. As with FIG. 16A, it is important to reduce noise supplied to the circuit since such noise can adversely affect the VCO output signal. Also, ac-coupling capacitors 2919 may be employed to isolate DC voltage from 2905 and 2907 to varactors 2920.

Figure 16D:
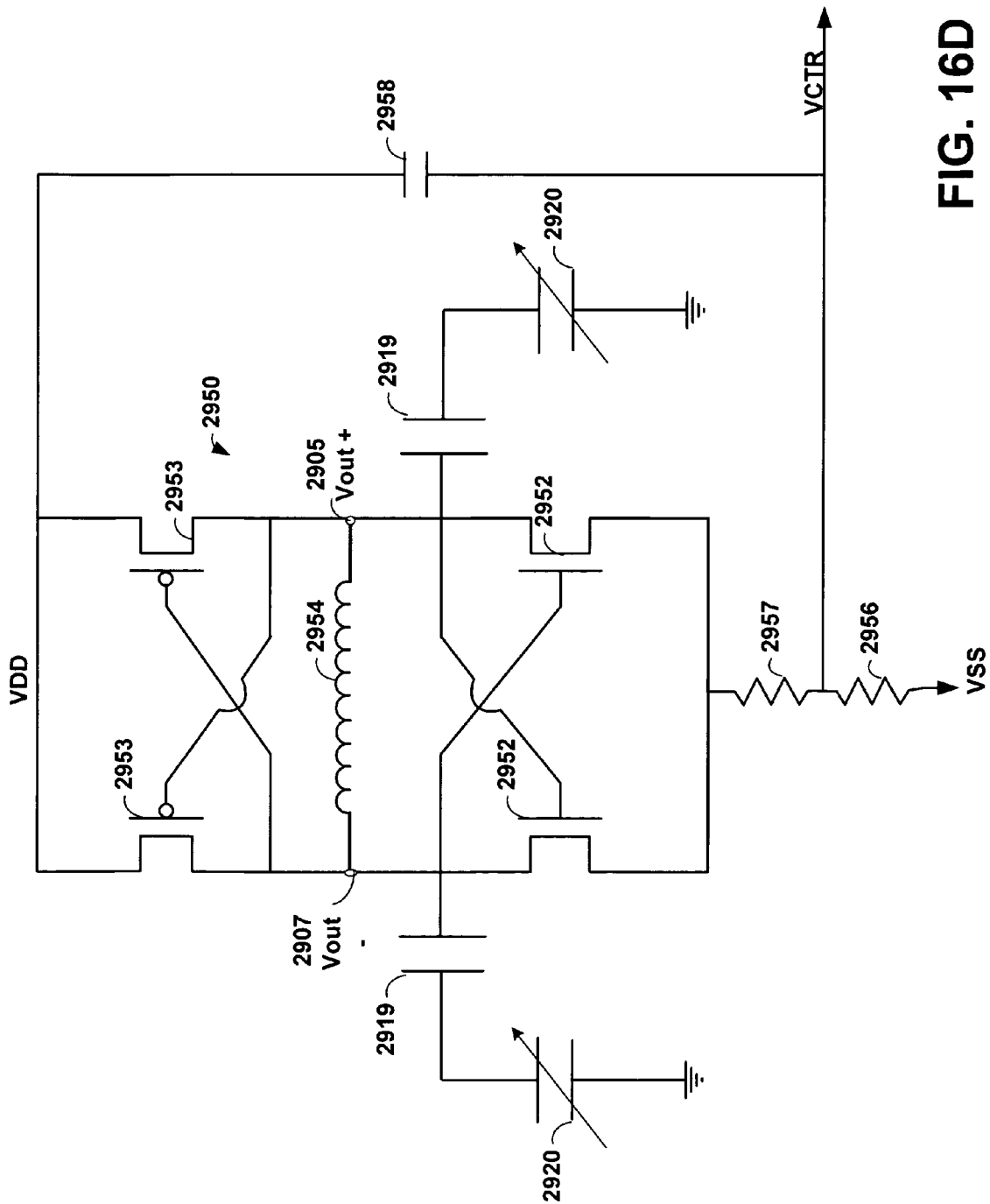

FIG. 16D depicts yet another embodiment of a VCO. Here VCO 2950 comprises two pairs of cross-coupled transistors, an NFET pair 2952 and a PFET pair 2953. The output of VCO 2950 is again taken as the differential across inductor 2954 at terminals 2905 and 2907. An RC circuit comprising a resistor 2956, a capacitor 2958, are again used to filter 1/f noise and white noise from the power supply noise to VCO 2950. Additionally, the filtering node, VCTR, may be brought out of the chip to connect to a larger capacitor for better filtering. This clean voltage may be used as a clean control voltage for other purposes. It is also important to note in FIG. 16D that the voltage applied to 2950 between the sources of NFET pair 2952 and VDD may be dropped or reduced by resistor 2957. This resistor also functions to raise the voltage between VCTR and VDD.

The VCOs provided above each include a filtering circuit that reduces noise contained within signals provided to the VCO and hence helps to stabilize the VCO's output. The noise filtered may include 1/f noise, power supply noise, bias voltage noise or other like sources of noise. Although only cross coupled VCOs were depicted in the FIGs, any similar VCO known to those skilled in the art may be used.

The invention disclosed herein is susceptible to various modifications and alternative forms. Specific embodiments therefore have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

The invention claimed is:

1. A high speed bit stream data conversion circuit comprising:
    a data conversion circuit operable to:
        receive a plurality of first bit streams at a first bit rate and a corresponding first bit stream data clock; and
        produce at least one second bit stream at a second bit rate, wherein:
            the number of the plurality of first bit streams is greater than the number of the at least one second bit stream(s),
            the bit rate of the at least one second bit stream(s) is greater than the bit rate of the plurality of first bit stream(s),
        wherein the data conversion circuit comprises:
            a plurality of drivers used to drive signals based upon the plurality of first bit streams and/or the first bit stream data clock; and
            a clock circuit operable to:
                produce a Reference Clock Signal based upon the first bit stream data clock, wherein the Reference Clock Signal is operable to latch the plurality of first bit streams; and
                wherein the clock circuit comprises:
                    a phase locked loop (PLL) having a phase detector operable to receive the first bit stream data clock and a loop output;
                    a charge pump;
                    a loop filter;
                    a Voltage Controlled Oscillator (VCO); and
                    a divider operable to produce the loop output;
        wherein the VCO is tuned at an operating frequency corresponding to at least one tuning setting; and
        wherein at least some of the plurality of drivers is tuned based upon the at least one tuning setting.

2. The high speed bit stream data conversion circuit of claim 1, wherein the VCO includes a plurality of switchable tuning capacitors, and wherein the at least one tuning setting comprises switch settings of the plurality of switchable tuning capacitors.

3. The high speed bit stream data conversion circuit of claim 2, wherein the switchable tuning capacitors comprise coarse tuning capacitors and fine tuning capacitors.

4. The high speed bit stream data conversion circuit of claim 2, wherein the switchable tuning capacitors of the VCO correspond to switchable tuning capacitors of the plurality of drivers, and wherein the VCO and the plurality of drivers are tuned by using consistent switch settings.

5. The high speed bit stream data conversion circuit of claim 1, wherein the VCO includes a varactor, and wherein the at least one tuning setting comprises a varactor setting.

6. A high speed bit stream data conversion circuit comprising:
    a data conversion circuit operable to:
        receive at least one first bit stream(s) at a first bit rate and a corresponding first bit stream data clock; and
        produce a plurality of second bit streams at a second bit rate, wherein:
            the number of the plurality of second bit streams is greater than the number of the at least one first bit stream(s),
            the bit rate of the at least one first bit stream(s) is greater than the bit rate of the plurality of second bit stream(s),
        wherein the data conversion circuit comprises:
            a plurality of drivers used to drive signals based upon the at least one of first bit stream(s) and/or the first bit stream data clock; and
            a clock circuit operable to:
                produce a Reference Clock Signal based upon the first bit stream data clock, wherein the Reference Clock Signal is operable to latch the at least one first bit stream(s); and
                wherein the clock circuit comprises:
                    a phase locked loop (PLL) having a phase detector operable to receive the first bit stream data clock and a loop output;
                    a charge pump;
                    a loop filter;
                    a Voltage Controlled Oscillator (VCO); and
                    a divider operable to produce the loop output;
                wherein the VCO is tuned at an operating frequency corresponding to at least one tuning setting; and
                wherein at least some of the plurality of drivers is tuned based upon the at least one tuning setting.

7. A clock circuit that produces a Reference Clock Signal used to latch data between a plurality of first bit streams at a corresponding first bit stream data clock and at least one second bit stream(s), wherein the number of the plurality of first bit streams is greater than the number of the at least one second bit stream(s), and wherein the bit rate of the at least one second bit stream(s) is greater than the bit rate of the plurality of first bit streams, wherein a plurality of drivers drive signals based upon the a plurality of first bit streams and/or the first bit stream data clock, wherein the clock circuit comprises:
    a phase locked loop (PLL) having a phase detector that receives the first bit stream data clock and a loop output, a charge pump, a loop filter, and a Voltage Controlled Oscillator (VCO), and a divider that produces the loop output, and wherein the VCO is tuned at an operating frequency corresponding to at least one tuning setting; and wherein at least some of the plurality of drivers is tuned based upon the at least one tuning setting.

8. The clock circuit of claim 7, wherein the VCO includes a plurality of switchable tuning capacitors, and wherein the at least one tuning setting comprises switch settings of the plurality of switchable tuning capacitors.

9. The clock circuit of claim 8, wherein the capacitors comprise coarse tuning capacitors and fine tuning capacitors.

10. The clock circuit of claim 7, wherein the VCO includes a varactor, and wherein the at least one tuning setting comprises a varactor setting.

11. The clock circuit of claim 8, wherein the switchable tuning capacitors of the VCO correspond to switchable tuning capacitors of the plurality of drivers, and wherein the VCO and the plurality of drivers are tuned by using consistent switch settings.

12. The clock circuit of claim 10, wherein the varactor of the VCO corresponds to varactors of the plurality of drivers, and wherein the VCO and the plurality of drivers are tuned by using consistent varactor settings.

13. The clock circuit of claim 7, wherein the plurality of drivers also serve as buffers.

14. The clock circuit of claim 7, wherein the VCO further comprises a filter circuit that further comprises a resistor and a capacitor, and wherein the resistor acts to reduce the voltage applied to the VCO.

15. A clock circuit that produces a Reference Clock Signal used to latch data between at least one first bit streams at a corresponding first bit stream data clock and a plurality of second bit stream(s), wherein the number of the plurality of second bit streams is greater than the number of the at least one first bit stream(s), and wherein the bit rate of the at least one first bit stream(s) is greater than the bit rate of the plurality of second bit streams, wherein a plurality of drivers drive signals based upon the at least one first bit streams and/or the first bit stream data clock, wherein the clock circuit comprises:

a phase locked loop (PLL) having a phase detector that receives the first bit stream data clock and a loop output, a charge pump, a loop filter, and a Voltage Controlled Oscillator (VCO), and a divider that produces the loop output, and wherein the VCO is tuned at an operating frequency corresponding to at least one tuning setting; and wherein at least some of the plurality of drivers is tuned based upon the at least one tuning setting.

16. A method for tuning a plurality of drivers to operate at an operating frequency, comprising the steps of:

tuning a Voltage Controlled Oscillator (VCO) within a Phase Locked Loop (PLL) of a clock circuit to the operating frequency such that such tuning produces at least one tuning setting;

transferring the at least one tuning setting that cause the VCO to operate at the operating frequency to scaled amplifiers within the plurality of drivers that operate on a plurality of first bit streams and/or at least one second bit stream(s) data at the operating frequency.

17. The method of claim 16, wherein the VCO includes a plurality of switchable tuning capacitors, and wherein the at least one tuning setting comprises switch settings of the plurality of switchable tuning capacitors.

18. The method of claim 17, wherein the plurality of switchable tuning capacitors further comprise coarse tuning capacitors and fine tuning capacitors.

19. The method of claim 16, wherein the VCO includes a varactor, and wherein the at least one tuning setting comprises a varactor setting.

20. The method of claim 17, wherein the plurality of switchable tuning capacitors of the VCO correspond to switchable tuning capacitors of the plurality of drivers, and wherein the VCO and the plurality of drivers are tuned by using consistent switch settings.

21. The method of claim 19, wherein the varactor of the VCO corresponds to a varactors of the plurality of amplifiers, and wherein the VCO and the plurality of drivers are tuned by using consistent varactor settings.

22. The method of claim 17, wherein the plurality of drivers also serve as buffers.

23. A method for tuning a plurality of drivers to operate at an operating frequency, comprising the steps of:

tuning a Voltage Controlled Oscillator (VCO) within a Phase Locked Loop (PLL) of a clock circuit to the operating frequency such that such tuning produces at least one tuning setting;

transferring the at least one tuning setting that cause the VCO to operate at the operating frequency to scaled amplifiers within the plurality of drivers that operate on a at least one first bit stream(s) and/or a plurality of second bit streams data at the operating frequency.

24. The high speed bit stream data conversion circuit of claim 5, wherein the varactor of the VCO corresponds to varactors of the plurality of drivers, and wherein the VCO and the plurality of drivers are tuned by using consistent varactor settings.

* * * * *